United States Patent
Frenken et al.

(10) Patent No.: US 11,749,977 B2
(45) Date of Patent: Sep. 5, 2023

(54) CUTTING DEVICE FOR THE SEVERANCE OF AN ELECTRICAL POWER CABLE, OR OF A STRAND SECTION

(71) Applicants: GREENLEE TOOLS, INC., Rockford, IL (US); GUSTAV KLAUKE GMBH, Remscheid (DE)

(72) Inventors: Egbert Georg Gottfried Frenken, Heinsberg (DE); William John McNulty, Washington, DC (US); Torsten Darkow, Wuppertal (DE); Andreas Lehr, Neuss (DE)

(73) Assignees: GUSTAV KLAUKE GMBH, Remscheid (DE); GREENLEE TOOLS, INC., Rockford, IL (US)

( * ) Notice: Subject to any disclaimer, the term of this patent is extended or adjusted under 35 U.S.C. 154(b) by 38 days.

(21) Appl. No.: 16/815,347

(22) Filed: Mar. 11, 2020

(65) Prior Publication Data
US 2020/0212661 A1     Jul. 2, 2020

Related U.S. Application Data

(62) Division of application No. 15/540,329, filed as application No. PCT/US2016/012417 on Jan. 7, 2016, now abandoned.

(Continued)

(51) Int. Cl.
*H02G 1/00*     (2006.01)
*G01R 21/00*     (2006.01)
(Continued)

(52) U.S. Cl.
CPC ........... *H02G 1/005* (2013.01); *G01R 21/006* (2013.01); *H01B 9/02* (2013.01); *H02G 9/02* (2013.01)

(58) Field of Classification Search
CPC ....... B26B 17/00; Y10T 83/04; Y10T 83/175; Y10T 83/404; Y10T 83/412; H02G 1/00;
(Continued)

(56) References Cited

U.S. PATENT DOCUMENTS 2,248,642 A    7/1941   Phillips
2,823,454 A *   2/1958   Kirchner ................ H02G 1/005
                                               30/228
(Continued)

FOREIGN PATENT DOCUMENTS

AU        1485272 A    1/1974
CN       102019460 A    4/2011
(Continued)

OTHER PUBLICATIONS

International Search Report and Written Opinion for International Patent Application No. PCT/US2016/012417 dated Nov. 28, 2016, 20 pages.

(Continued)

*Primary Examiner* — Phong H Nguyen
(74) *Attorney, Agent, or Firm* — Klintworth & Rozenblat IP LLP

(57) ABSTRACT

A device is used to sever an electrical power cable for the transmission of high voltage. The device includes a frame having first movable cutting blade carried thereon and second stationary cutting blades carried thereon. The blades can sever the electrical power cable upon movement of the first cutting blade relative to the frame. A sensor is provided and is configured to register a position of the first cutting blade relative to the frame. An evaluation and/or transmission controller is configured to receive information from the sensor and interrupt severing of the electrical power cable by the blades in response to the information.

20 Claims, 20 Drawing Sheets

Related U.S. Application Data

(60) Provisional application No. 62/100,639, filed on Jan. 7, 2015.

(51) Int. Cl.
*H01B 9/02* (2006.01)
*H02G 9/02* (2006.01)

(58) Field of Classification Search
CPC ........ H02G 1/005; H02G 9/02; G01R 21/006; H01B 9/02
USPC ............ 30/92, 109, 111, 113, 194, 208, 209
See application file for complete search history.

(56) References Cited

U.S. PATENT DOCUMENTS

| | | | |
|---|---|---|---|
| 3,848,334 A | 11/1974 | Mattera et al. | |
| 4,026,028 A | 5/1977 | Green | |
| 4,736,480 A | 4/1988 | Bohl et al. | |
| 5,357,830 A | 10/1994 | Mori et al. | |
| 5,424,630 A | 6/1995 | Vazquez | |
| 6,532,790 B2* | 3/2003 | Frenken | B23D 23/00 72/409.16 |
| 6,552,522 B1 | 4/2003 | Zook | |
| 7,683,629 B2 | 3/2010 | Kurtz | |
| 7,746,055 B2* | 6/2010 | Bose | G01R 15/202 324/117 H |
| 9,372,207 B1* | 6/2016 | Brouwer | G01R 15/183 |
| 2003/0080722 A1 | 5/2003 | Noh | |
| 2004/0183689 A1 | 9/2004 | Luebke et al. | |
| 2004/0216239 A1 | 11/2004 | Simon et al. | |
| 2015/0258819 A1* | 9/2015 | Chiba | B26D 1/085 83/13 |

FOREIGN PATENT DOCUMENTS

| | | |
|---|---|---|
| CN | 103038962 A | 4/2013 |
| DE | 3525781 A1 | 1/1987 |
| DE | 20218307 U1 | 4/2003 |
| EP | 2568550 A2 | 3/2013 |
| KR | 20100062044 A | 6/2010 |
| WO | 2009/088296 A1 | 7/2009 |
| WO | Oo2014/002721 A1 | 1/2014 |

OTHER PUBLICATIONS

Translation of DE3525781A1.
Translation of DE20218307U1.
Translation of KR20100062044A.
Office Communication for corresponding European Patent Application No. 16704284.5 dated Jun. 14, 2019, 6 pages.
Webpage; "Fiche Technique Picoup-EXP-240," Sibille Fameca Electric, France, http://docs-europe.electrocomponents.com/webdocs/145e/0900766b8145ebf6.pdf, 2014, 2 pages.
Machine Translation of CN102019460A.
Office Action for Chinese Patent Application 202010483925.1 dated Nov. 3, 2021.
English Machine Translation of Office Action for Chinese Patent Application 202010483925.1 dated Nov. 3, 2021.
English Machine Translation of WO2014/002721A1.
English Machine Translation of CN103038962A.

* cited by examiner

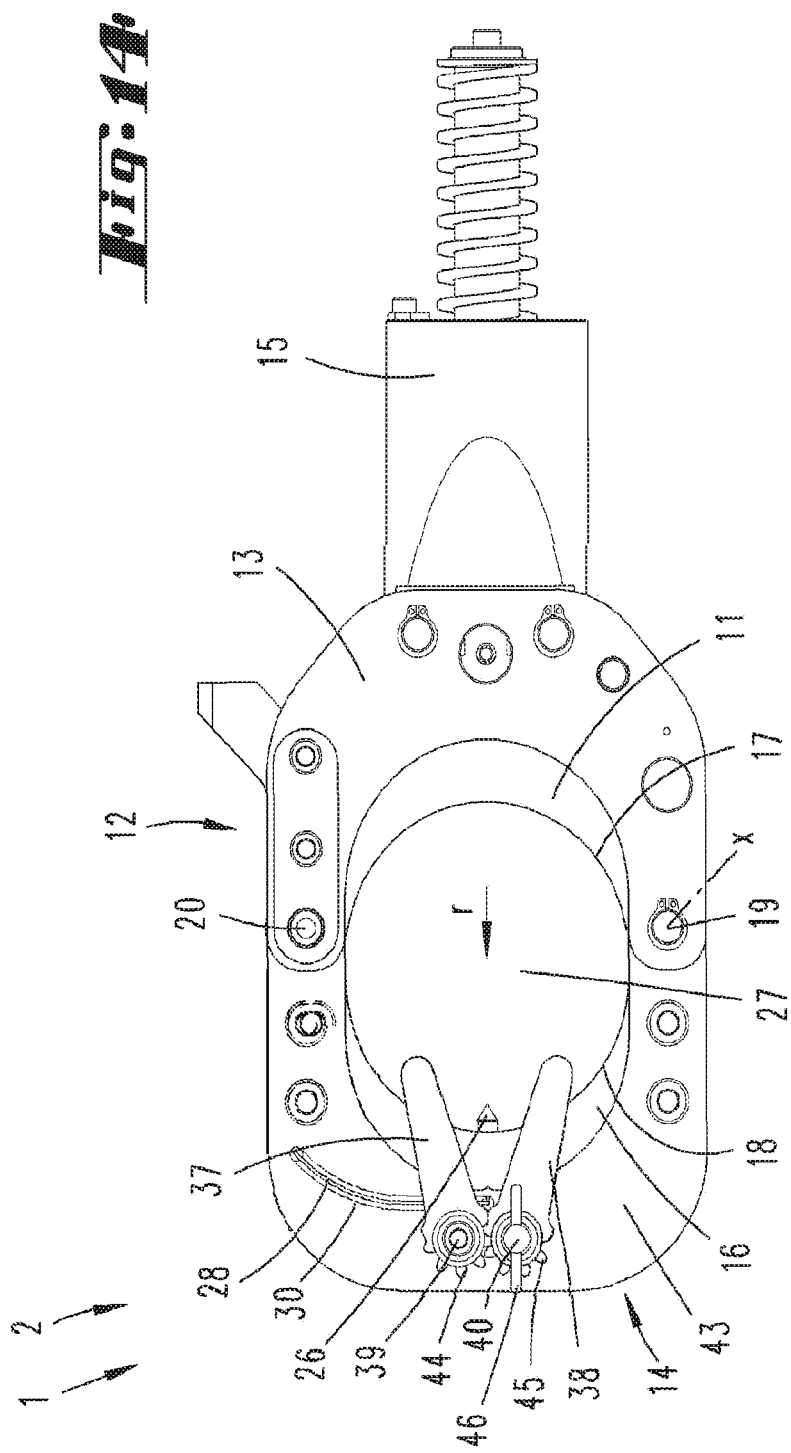

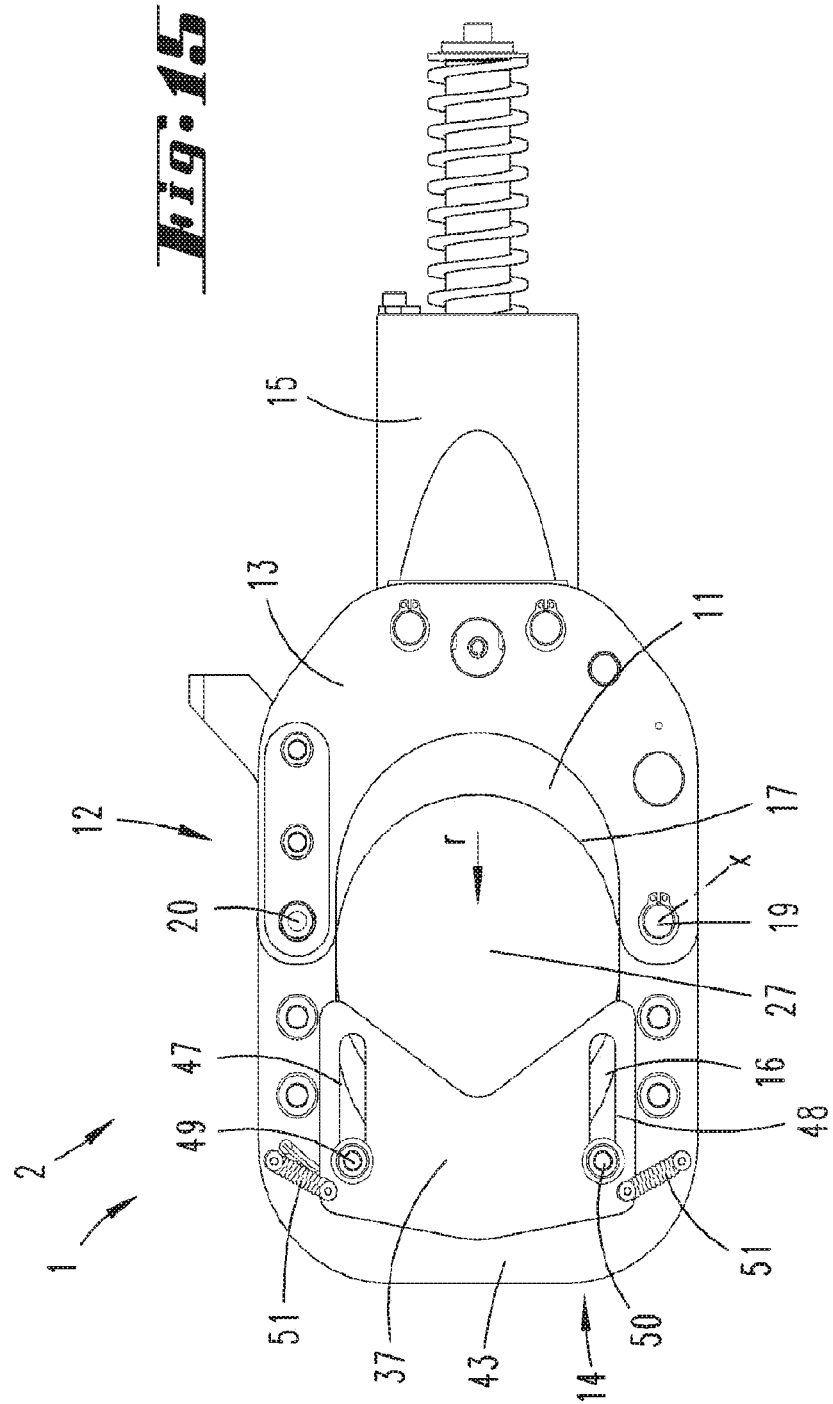

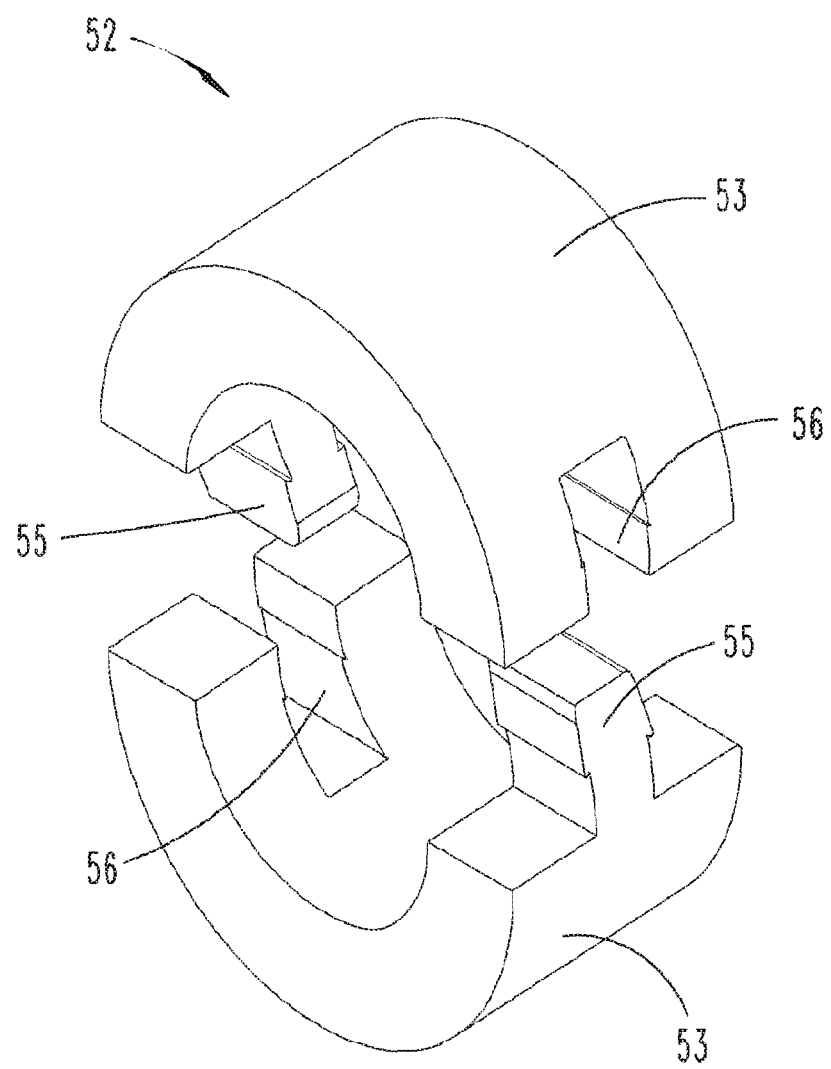

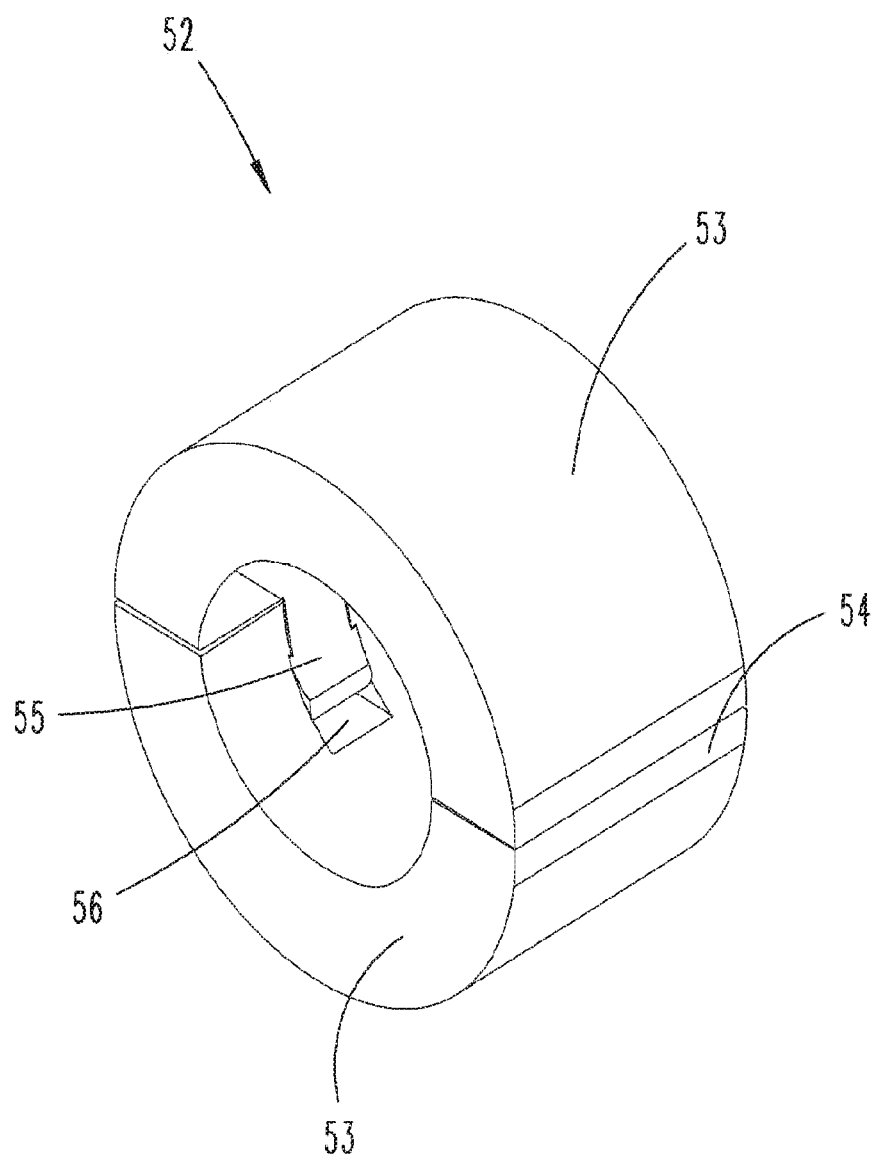

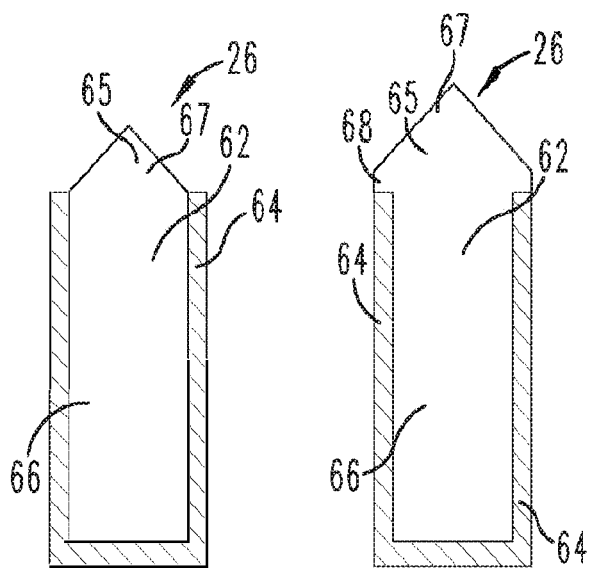
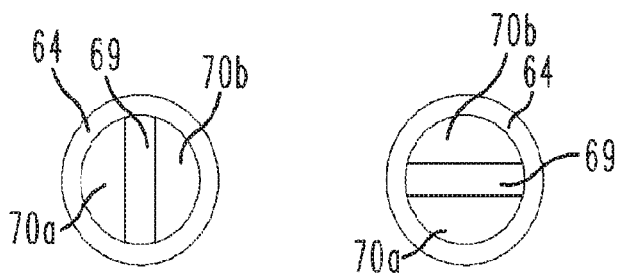
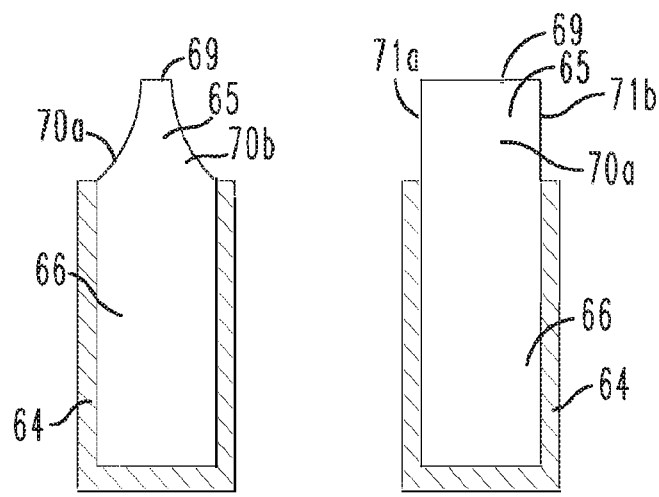

CUTTING DEVICE FOR THE SEVERANCE OF AN ELECTRICAL POWER CABLE, OR OF A STRAND SECTION

This application is a divisional application of U.S. Patent Application Ser. No. 15/540,329, filed on Jun. 28, 2017 which is a 371 of international PCT/US2016/012417, filed on Jan. 7, 2016, which claims the domestic benefit of U.S. Provisional Application Ser. No. 62/100,639, filed on Jan. 7, 2015, the contents of each being are incorporated herein in its entirety.

FIELD OF THE DISCLOSURE

A method for the severance of an electrical power cable, which is used for transmission of high voltage and which has an insulation sheath as well as a screening layer is provided.

BACKGROUND

Methods are known and are used, for example, when working on so-called buried cables, and in particular on buried cables, which are installed and which are at least ready for operation.

In particular, in the case of installed electrical power cables for the transmission of high voltage, there is a risk that they are still electrically loaded in the course of the severance, which can lead to endangering the persons, who bring about the severance of the power cable. It can also lead to damages to the cutting device.

With regard to the known state of the art, the problem is to specify a method of the type in question, which in particular ensures the safety of the person, who uses the method.

SUMMARY

According to a first aspect, a possible solution of the task is provided in the case of a method, the focus of which is on that, during the severance of the cable, a measurement is executed in terms of the electrical load on the cable by a measuring device and that, in the event of registering a (relevant) electrical load, a signal is outputted from the measuring device.

The safety, in particular of the person carrying out the method, and further of the person who brings about a severance of an electrical power cable, is significantly increased by the proposed method. A measurement of the electrical load of the power cable is executed in the course of the severance of the cable. In the event of hereby registering an electrical load, which reaches or exceeds a predetermined load value, a signal, which is unambiguous for the user, is thus outputted, whereupon a reaction, which is more relevant with regard to safety, takes place or is requested.

The measurement can take place in the course of penetrating into or when moving through the screening layer and/or the insulation sheath of the power cable. A measurement is made between the screening layer and an insulation sheath, which surrounds the electrically conducting wires. In the event that the insulated electrically conductive wires are electrically loaded with high voltage, this leads to a measurable electrical load between the screening layer and the insulation sheath. The test voltage, which is to be registered here, in the event of an electrical loading of the power cable lies within the range of a few hundred millivolt, for example 200 to 600 millivolts, up to a few Volts, for example 1 to 5 Volts. Accordingly, the electrical load to be tested lies within the safety-relevant range, but allows to draw conclusions to the load of the power cable as a whole within the high voltage range.

The signal in the event of registering an electrical load can be an optical signal, for example a generated light signal. The signal can also occur acoustically. The signal can furthermore also be an electrical signal, for example for the further evaluation. The electrical signal can be a radio signal, which means or shows that an impermissible voltage was determined. As an alternative to a radio connection, provision can also be made for an optical connection (light cable, such as optical fiber, for example). Provision can also be made for a voltage signal to be transferred to a display, for example, and to thus be illustrated graphically.

The generated signal can furthermore also be transmitted via a cable, for example by modulating. It can be transmitted as an optical signal via a cable, which is suitable for optical transmission, for example a glass fiber cable.

The measurement can furthermore be executed by a measuring device connected with the cutting device. The measuring device can be connected non-detachably with the cutting device. In the alternative, the measuring device can be fitted detachably with the cutting device.

The measuring device may have its own power supply for evaluating the measuring signal and for outputting a signal in the event of registering an electrical load. For this purpose, provision can be made, e.g., for a battery or an accumulator. In the event that the cutting device is operated electrically, they can also be used to supply the power for the measuring device.

The measurement may be executed repeatedly in the course of the severance, for example at a frequency, which is a function of the cutting speed, that is, of the penetration speed into the power cable.

In the event of registering an impermissible electrical load on the cable by the signal, the severance process may be terminated automatically. In the case of an electrically or hydraulically actuated cutting device, in the case of a cutting blade is moved towards or along a further cutting blade, a generated signal may lead to the shut-down of the cutting blade advance and, if applicable, to a return of the cutting blade. In the case of a hand-operated cutting device, for example lever-operated cutting device, a termination of the severance process can be attained, for example by mechanically interrupting a lever transmission on the movable cutting blade.

The disclosure furthermore relates to a method for the severance of a strand section, in particular of an electrical power cable, by a cutting device, which has a cutting device aperture, formed so as to enclose the strand section.

The cutting device provided for this purpose is capable of being opened with regard to the cutting device aperture, in particular for the severance of longer or installed strand sections (such as, for example, power cables in the form of buried cables) for surrounding the strand section during the severance process.

With regard to the aperture cross-section thereof, the cutting device aperture is so large such that strand sections of different diameters or cross-section geometries, respectively, can be severed with the same cutting device.

Strand sections comprising a cross-section, which is small as compared to the cutting device aperture, can result in an unfavorable orientation of the strand section within the cutting device aperture in the course of the severance process, thus also to a tilting of the strand section from a vertical to the aperture surface. This can lead to a cut, which is inexact and which might run at an incline.

With regard to the known state of the art, a technical problem of the disclosure is seen in improving a method of the type in question.

According to a first aspect, a possible solution of the task is provided in the case of a method, which focuses on surrounding the strand section with an adapter, which is matched to the aperture dimension of the cutting device aperture and on then introducing the adapter with the strand section into the cutting device aperture.

A correct, predetermined orientation of the strand section to be severed can be attained within the cutting device aperture by the adapter. The adapter for this can be present in the form of a pipe section, comprising an inner cross-section, which is matched to the outer cross-section of the strand section, and comprising an outer cross-section, which is matched to the cutting device aperture. By using such an adapter, it is thus furthermore made possible to place the strand section, for example exactly in the center of the cutting device aperture.

The adapter may be destroyed in the course of the severance of the strand section, because the adapter is also severed. Accordingly, the adapter can only be used once.

For reutilization, the adapter can also include two adapters, which are connected with one another via severable webs or the like. The webs can be replaceable plug-in components or the like.

The disclosure also relates to a device for the severance of an electrical power cable for the transmission of high voltage, and which has a conductive sheath and also a screening layer, with a cutting blade.

Such devices are known, in particular in the form of hydraulically and/or electromotively driven devices.

With regard to the known state of the art, a technical problem of the disclosure is to provide a device of the type in question to be safer.

According to a first aspect, a possible solution of the task is at hand in the case of a device, the focus of which is on the fact that the device is in operative connection with a controller for purposes of interrogating the electrical load on the cable and on the fact that the severance process can be interrupted as a function of a signal outputted from the controller.

According to the proposed solution, a device is created, which is safe with regard to the use, and in particular with regard to the user, who uses the device. In the event of registering a relevant electrical load in the course of the cutting or severance process, respectively, the severance process is interrupted. The load interrogation is made directly in the course of the severance process, for the purpose of which the device is in operative connection with the mentioned controller.

The mentioned controller is an evaluation and transmission controller. Insofar as reference is made hereinbelow to an evaluation and transmission controller, this also always refers to the controller as such.

The controller can have a measuring probe, which penetrates into the insulation sheath of the cable in the course of a severance. By reaching or penetrating, respectively, into the insulation sheath, an electrically conductive contacting between insulation sheath and measuring probe is attained, in particular in the case of a standard design of the insulation sheath as semi conductive polymer conductor.

The measuring probe penetrates into at least one layer, which surrounds the insulation sheath, in particular the screening layer, and a sheath, which surrounds the screening layer so as to be flush therewith. For this purpose, the measuring probe may be formed as a spike. The spike may be shielded in a circumferentially insulating manner. Only the region of the spike can be exposed for electrical contacting.

The measuring probe can be arranged opposite a movable cutting blade of the device. In the course of the severance process, the movable cutting blade moves successively towards the measuring probe and in particular towards a spike of the measuring probe. Provision can also be made for the movable cutting blade to move past the measuring probe in a laterally offset manner when a severance process has ended (when no relevant electrical load was registered).

The measuring probe can be mounted on a stationary cutting blade, on which the movable cutting blade moves in the course of the severance process. In the course of the severance process, the movable cutting blade runs with a broad side along the broad side of the stationary cutting blade facing it.

The measuring probe may be provided on the side of the stationary cutting blade which faces away from the movable cutting blade. The measuring probe thus penetrates into the cable in a plane, which is offset to the cutting plane of the cutting blades.

The measuring probe is electrically connected with the evaluation and transmission controller. For this purpose, provision may be made for an electrical cabling within the device.

The entire measuring arrangement of the device, thus in particular the measuring probe and the evaluation and transmission controller is furthermore provided with its own power supply. In the alternative, in particular in the case of an electrical device for the severance of strand sections, the electrical supply of the measuring device can also take place via the device supply.

The evaluation and transmission controller can be arranged at a distance from the measuring probe. The signal transmission between measuring probe and evaluation and transmission controller can be attained directly in an electrical manner via a cable connection. In the alternative, a communication is also possible via radio or in an optical manner. A single evaluation controller, which is in contact with the transmission controller via radio, for example, can also be arranged at a distance from the measuring probe.

The evaluation controller compares the value of the electrical load interrogation in the course of a severance process, the interrogation may be carried out repeatedly with a maximum reference value, which is stored in particular. In the event of reaching or exceeding the maximum value or generally also in the event of registering a load value, the evaluation controller generates a signal, which may lead to the interruption of the severance process.

The evaluation and transmission controller can also be provided directly at the device, whereby a compact device is specified, which includes the load control in the course of the severance process.

The device has a cutting head, which is formed so as to encompass the cable completely. For this purpose, the cutting head has a cutting head aperture, which, for the severance of the power cable or a strand section, respectively, is penetrated by it.

In particular, for the severance of long and/or installed electrical power cables, which are in particular installed in the ground, the cutting head can be opened so as to place it around the cable to be severed. For this purpose, the cutting head has a pivotable frame section, which, if applicable, supports the stationary cutting blade. Prior to executing the severance process, the pivotable frame section must be fixed and locked to a stationary frame section, which, if applicable, guides the movable cutting blade.

The evaluation and transmission controller can be arranged on the cutting head, thus for example at the pivotable frame part of the cutting head. A signal generated by the evaluation controller in the event of the registration of a load in the course of the severance process can transmit via the transmission controller, for example via radio transmission, to a receiving controller of the device, which can actuate the device electromotively or hydraulically. The receiving controller generates a signal for interrupting the severance process by stopping the device drive and/or returning the device drive and associated relocation of the movable cutting blade.

The evaluation and transmission controller can also be arranged laterally displaced from a traverse path of the movable cutting blade. The evaluation and transmission controller is thus arranged in a plane, which is offset to a cutting plane between the movable and the stationary cutting blade.

In the closed position, the cutting blade can be locked by a locking bolt. Provision may be made for a locking bolt, which can be displaced transverse to the direction of displacement of the movable cutting blade and which is held at a stationary frame section of the device and which, in the locked position, penetrates a corresponding borehole of the pivotable frame section of the device. The pivotable frame section of the device may be held on the stationary frame section so as to be capable of being pivotably moved about a pivot axis, which is oriented parallel to the bolt axis.

The position of the locking bolt, in particular the locked position, can be registered via a sensor. This can be a proximity sensor or also a magnetic sensor.

The position of the locking bolt can be registered and evaluated in the evaluation and transmission controller. In the event that a correct locked position of the bolt is registered, for example, a severance process can thus be triggered. If applicable, the correct locked position also ensures the correct positioning of the measuring probe, so that a correct load test of the cable can also be executed in the event of a correct locking.

The registration of an incorrect locked position of the bolt interrupts the drive for moving the cutting blade, for example, or does not allow actuation. If applicable, an optical and/or acoustic error display can also take place additionally.

With regard to its position, the movable cutting blade can also be registered via a sensor. In particular, the cutting blade end position can be registered in a sensory manner so as to ensure that the cutting process was executed completely.

The movable cutting blade can thus have a passive sensor or target, which is displaced accordingly with the movable cutting blade in the course of the severance of the cable.

The passive sensor or target can be a magnet and/or RFID unit or reflector unit. The passive sensor may be provided on the movable cutting blade, at a position which does not penetrate the cable in the course of the severance.

The passive sensor can be interrogated by an active sensor. The active sensor may be fastened to the device and, for example, on the pivotable frame section of the cutting head.

In the event of registering the passive sensor or target on the cutting blade side, the active sensor generates an end position signal, which represents the finalization of the severance process. The generated signal can be represented as optical and/or acoustic signal or also as electrical signal for relocating the movable cutting blade into the initial position.

In one embodiment, the active sensor can be accommodated in the evaluation and transmission controller. As a further alternative, the signal generated via a separate evaluation controller can be transmitted to the equipment, which operates the device, for example, in the event of registering the passive sensor.

The disclosure furthermore relates to a cutting device, in particular a cutting device that can be actuated hydraulically or electrically with a cutting head, which is formed so as to encompass an item to be cut, with a movable and a stationary cutting blade, which can be traversed linearly relative to one another.

Cutting devices of the type in question have a cutting device aperture in the region of the cutting head, which is suitable to penetrate items to be cut comprising different cross-sectional dimensions. The problem of an unsatisfactory cut often results in particular in the case of items to be cut, which have cross-sections, which are relatively small as compared to the aperture dimension, for example cross-sectional dimensions, which correspond to half or less of the maximum aperture dimension of the device aperture.

With regard to the known state of the art, it is a technical problem of the disclosure to further improve a cutting device of the type in question.

According to a first aspect, the task is solved in that a positioning part is provided on the stationary and/or movable cutting blade, which positioning part, in the course of the traverse of the movable cutting blade, pushes the item to be cut towards a central region of the movable cutting blade with respect to an extent transverse to the direction of displacement of the movable cutting blade.

By arranging the positioning part, the item to be cut is displaced essentially into the central region with respect to the aperture cross-section of the cutting device. In this position, which is oriented centrally, if applicable, the item to be cut is severed.

Cross-sections, which are at least approximately always the same, result from this. It can also be ensured through this that the item to be cut is severed completely due to overlapping of the cutting blades relative to one another.

In combination with a measuring device of the above-described type for load interrogation of a power cable, there is a further positive effect, namely that the item to be cut, here the power cable, is always oriented in such a manner independent from the outer diameter thereof that a provided measuring probe can penetrate into the cable properly and can execute the corresponding measurement.

The positioning part can be formed in the shape of an arm, which is oriented at an acute angle to the traverse direction of the movable cutting blade. This arm can be shaped in an elongated straight manner, but, if applicable, the longitudinal extension thereof can also run in a convex or also concavely curved manner.

The positioning part in total can also be moved in a guided manner in a direction of displacement of the movable cutting blade. The movement of the positioning part can hereby result directly from the movement of the cutting blade, for example by dragging the item to be cut across the movable cutting blade, into a stop position of the positioning part. In the stop position, the item to be cut is in an orientation within the cutting device aperture. In this orientation, the actual cutting process takes place hereafter.

In the case of a positioning part, which can be moved in a direction, which corresponds to the movable cutting blade, provision can be made for guidance. They can include one or a plurality of elongated holes with running guide pins mounted therein. The elongated holes may extend in the direction of displacement of the movable cutting blade and may be provided at the positioning part.

A movable positioning part can be displaced from an initial position, which is initially unloaded by the item to be cut, counter to a spring force, which effects a resetting. Such a spring force may be chosen to be so low that the movable cutting blade does not or does not significantly cut into the cable before the cable has reached a stop-limiting end position in the region of the positioning part or in the region of the stationary cutting blade, respectively.

The positioning part can also be deflected counter to the direction of displacement of the movable cutting blade in the course of a cutting operation. The positioning part can furthermore also be displaced essentially crosswise to the direction of displacement of the movable cutting blade in the course of the forward displacement of the movable cutting blade.

Two positioning parts may be arranged. The positioning parts can be arranged in a V-shape or are arranged running essentially parallel to one another. A preadjustment of the orientation of the positioning parts relative to one another, in particular of a function of the predetermined cross-sectional dimensions of the item to be cut can take place hereby. A manual adjustment may be used for this.

In the case of an arrangement of two positioning parts, such an adjustment of the two positioning parts can take place synchronously, that is, the adjustment of one positioning part inevitably leads to the corresponding adjustment of the other positioning part. Provision can be made for a synchronization drive.

The disclosure furthermore relates to an adapter for purposes of enclosing an item to be cut in the form of a strand.

Such an adapter can be used to adapt the strand-shaped item to be cut to an aperture cross-section of a cutting device, whereby an item to be cut comprising a comparatively small cross-sectional dimension can also be cut correctly in a cutting device comprising an aperture, which is large as compared thereto.

To offer an adapter of the type in question in a manner, which is cost-efficient from a manufacturing standpoint, it is proposed for the adapter to be formed from a material that can be cut easily, such as foam, plastic, such as, in particular, soft plastic, or balsa wood, and for the adapter to be formed in two parts, wherein the parts can be connected with one another for purposes of pivoting.

The material selection of the adapter provides a cost-efficient production thereof. At the same time, the adapter can be severed easily by a cutting device due to the material selection. The material can also be an elastically resilient foam.

The two-part design makes it possible to place such an adapter around an item to be cut, which, due to the length and/or installation type thereof, does not allow a one-part adapter to be slid on.

The adapter can have a substantially circular layout with respect to a view, in which a geometric axis of an aperture of the adapter for the passage of the item to be cut is in the form of a point. The layout may be adapted to an aperture cross-section of a cutting device and can accordingly also be formed essentially elongated and/or approximately rectangular.

A penetration of a measuring probe through the adapter and hereafter into the strand section to be severed is furthermore possible by the material selection of the adapter, which turns out to be advantageous in particular in the event of a cutting process of an electrically power cable, which might be under load.

The mentioned electrical load is in particular a voltage load. The voltage load can start at 1000 Volt (1 KV), for example, and can be up to 380,000 Volts (380 KV), for example. If applicable, it can also be higher.

BRIEF DESCRIPTION OF THE DRAWINGS

The disclosure is explained below by the enclosed drawing, which, however, only represents exemplary embodiments. A part, which is only explained with respect to one of the exemplary embodiments and which is not replaced by a different part in the case of a further exemplary embodiment due to the characteristic highlighted therein, is thus also described as a part, which might at least be possible for this further exemplary embodiment.

FIG. 14 shows a view of a further embodiment of the device;

FIG. 15 shows a view of the device in a further embodiment;

FIG. 16 shows an adapter for surrounding a strand-shaped item to be cut in a perspective individual illustration;

FIG. 17 shows an illustration, which corresponds to FIG. 4, of the device prior to severance of a strand-shaped item to be cut in the form of a power cable, which is provided with the adapter;

FIG. 19 shows the adapter in a further embodiment;

FIG. 20 shows a cross-sectional view of an electrical probe according to a further aspect;

FIG. 21 shows a cross-sectional view of an electrical probe according to yet another aspect;

FIGS. 22A and 22B show cross-sectional views of an electrical probe according to yet an even further aspect; and FIGS. 22C and 22D show top plan views of the electrical probe of FIGS. 22A and 22B.

DETAILED DESCRIPTION

Figure 1:
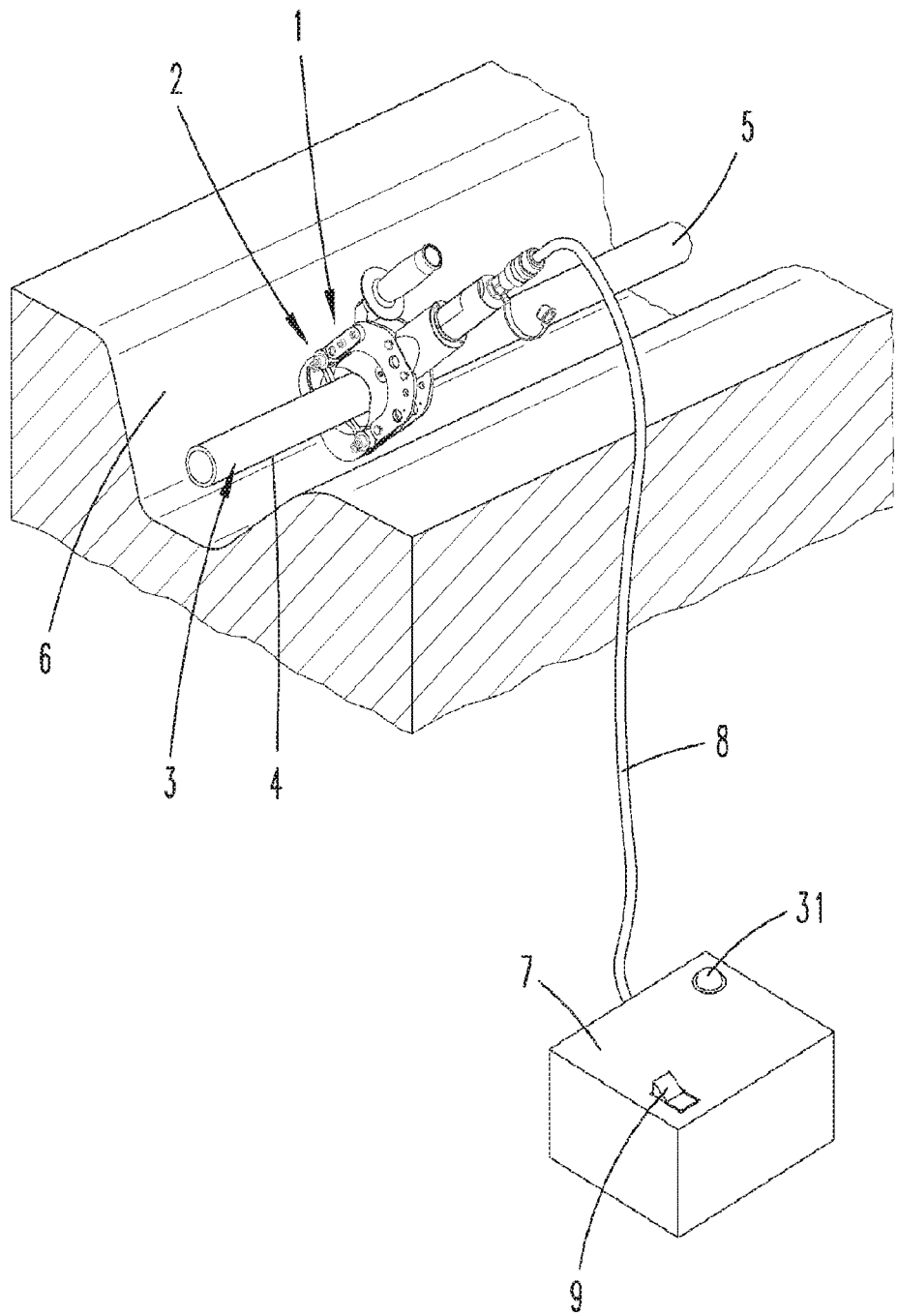
FIG. 1 shows a device for the severance of an electrical power cable in the form of a cutting device in the use state.

A device 1 in the form of a hydraulic cutting device 2 for the severance of a strand-shaped item to be cut 3, in particular a strand section 4, and, as illustrated, a power cable 5, is illustrated and described with reference to FIG. 1. Insofar as reference is made below to the power cable 5, the disclosure is also relevant for a strand-shaped item to be cut or a strand section, respectively, insofar as a voltage admission, as might possibly be present in the case of the electrical power cable, is not important. The electrical power cable 5 is a high voltage power cable.

FIG. 1 schematically illustrates a situation, in which the power cable 5, which is to be severed, is installed as item to be cut 3 in an exposed trench 6.

The cutting device 2 can be remotely controlled, by a control device 7, which is hydraulically and, if applicable, also electrically connected with the cutting device 2. A connecting dielectric hydraulic hose is provided with reference numeral 8.

The control device 7 has at least one activation switch 9. By actuating the activation switch 9, an electrically actuated hydraulic pump is activated in the control device 7 for conveying hydraulic oil from a hydraulic reservoir into a piston chamber, which is provided in the cutting device 2.

The hydraulic pump moves a piston 10 in the cutting device 2. A movable cutting blade 11 is fastened to the piston 10.

The cutting device 2 or the device 1, respectively, has a cutting head 12. It is formed in a frame-like manner for encompassing the item to be cut 3. The cutting head 12 includes a stationary frame section 13 and a frame section 14, which are pivotally connected to each other. The frame section 14 defines a pivotable frame section 14. The frame section 14 may be at least partially formed of a plate which is generally U-shaped such that an opening is defined. The frame section 13 may be formed of a pair of plates which are joined together such that an essentially forked layout is defined. The plates of frame section 13 may be generally U-shaped such that an opening is defined. The frame section 14 seats between the plates forming the frame section 13 and the openings face each other.

The stationary frame section 13 is connected to a handling section 15, in which, among others, the afore-described piston 10 is arranged so as to be linearly shiftable such that the piston 10 is movable relative to the stationary frame section 13.

First and second cutting blades 11, 16 are arranged in the cutting head 12. The cutting blade 11 has a cutting edge 17. The cutting blade 16 has a cutting edge 18. The movable cutting blade 11, which is connected with the piston 10, is attached to and guided within the stationary frame section 13. The stationary cutting blade 16 is attached to and guided within the pivotable frame section 14. The cutting blades 11, 16 face each other, but are laterally offset from each other.

Figure 5:
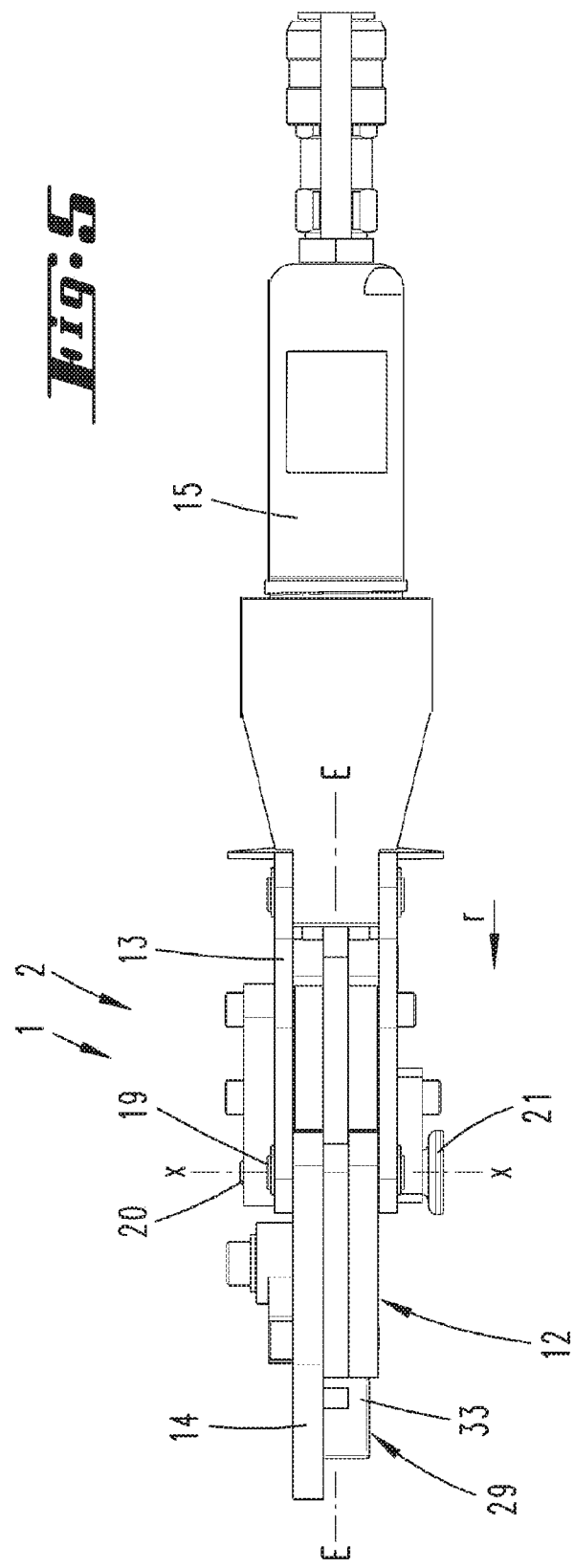
FIG. 5 shows the device in bottom view.
Figure 6:
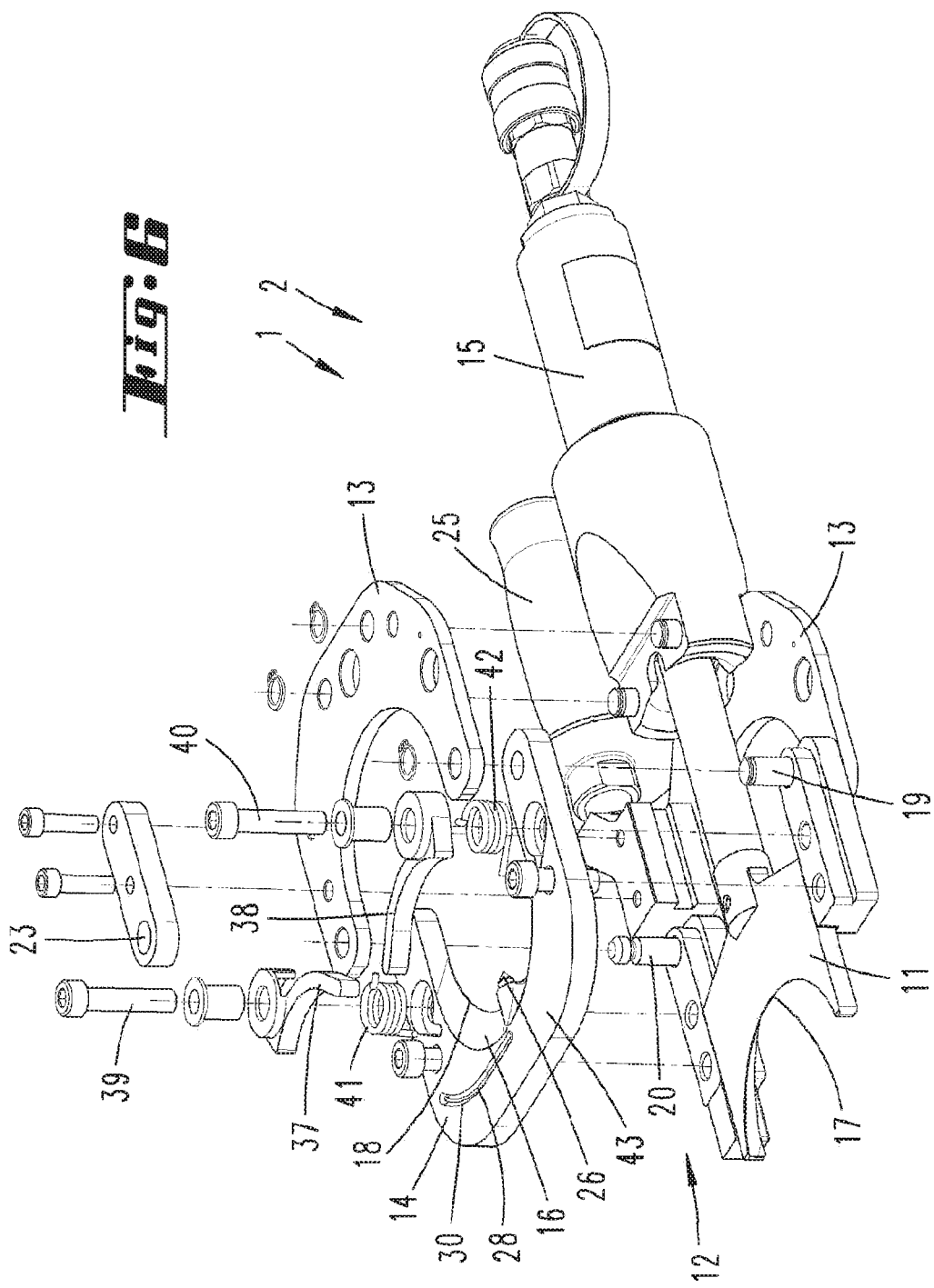
FIG. 6 shows the device in a perspective exploded illustration.
Figure 7:
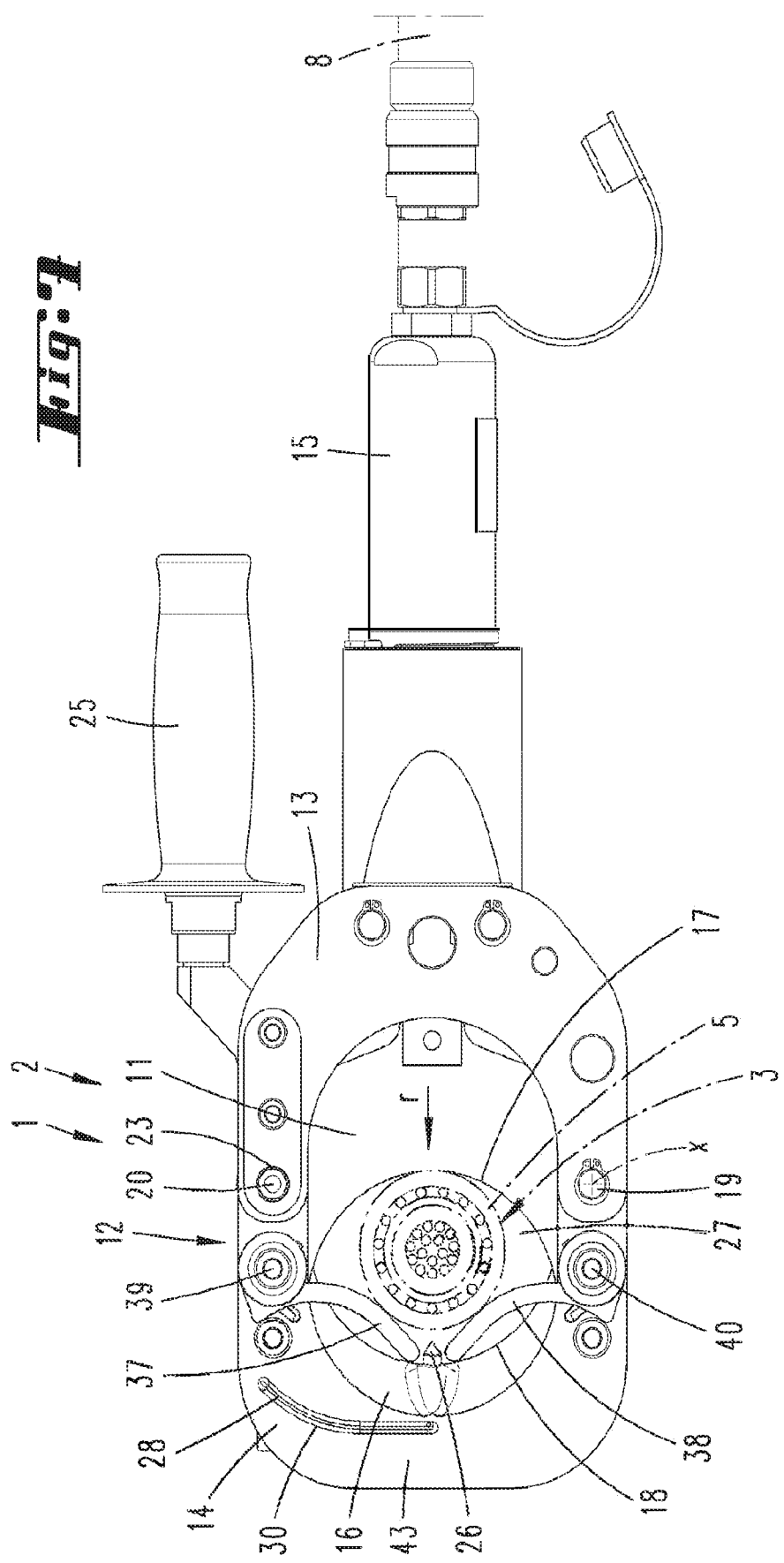
FIG. 7 shows an illustration, which corresponds to FIG. 4, comprising a strand section to be severed in the form of a power cable.
Figure 8:
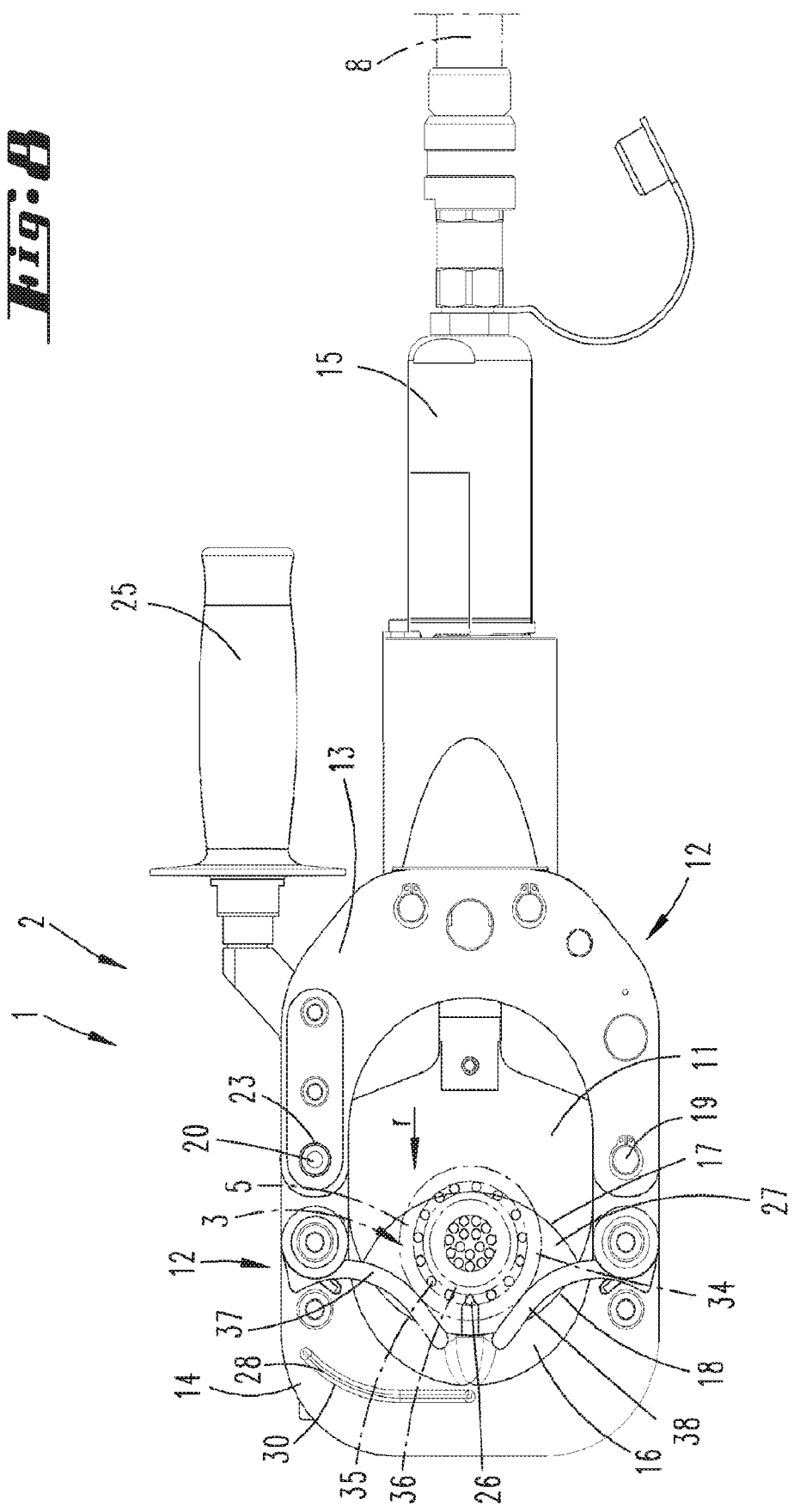
FIG. 8 shows an illustration, which corresponds to FIG. 7, but in the course of the cutting process.
Figure 9:
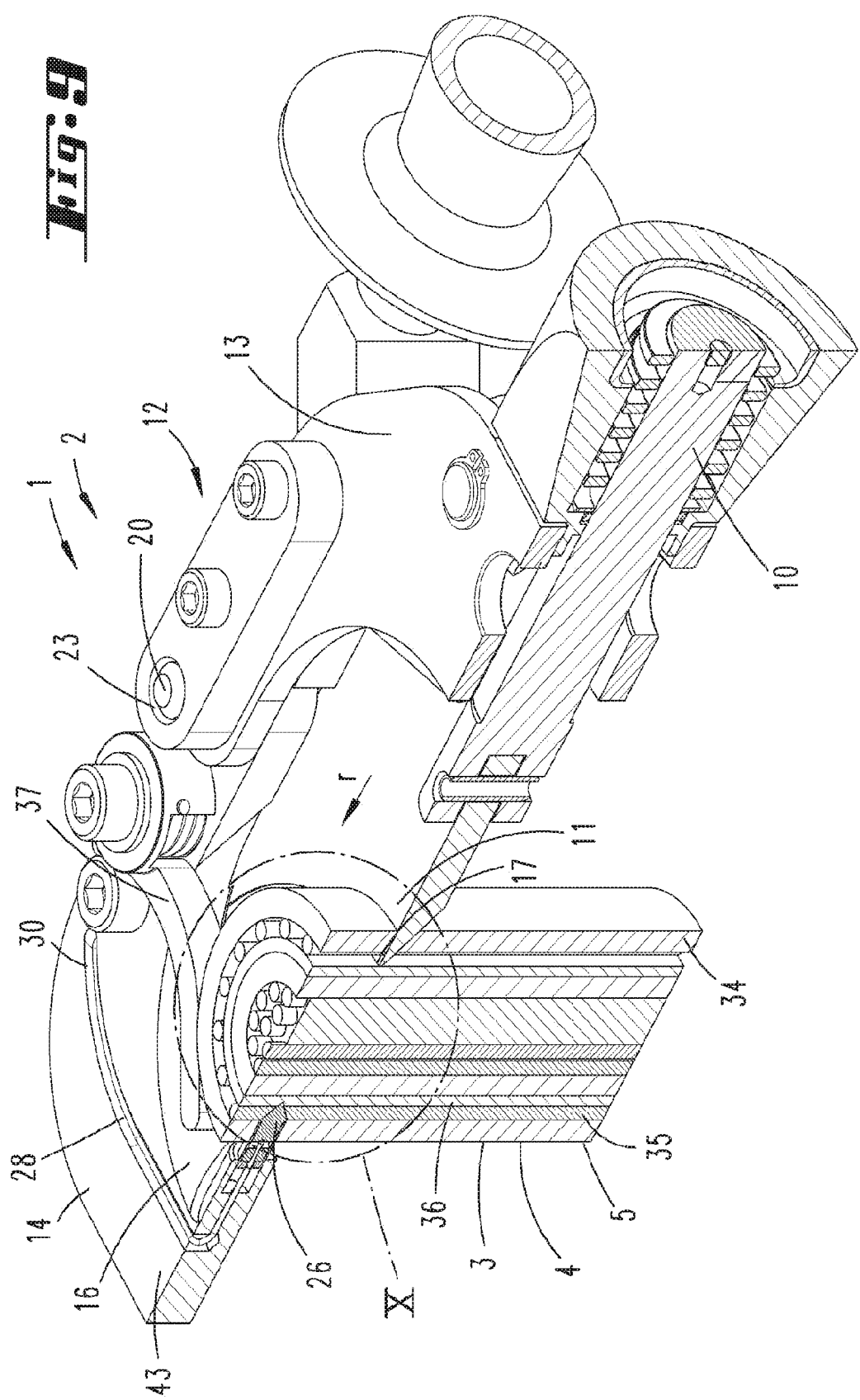
FIG. 9 shows the perspective section along line IX-IX in FIG. 4.

The movable cutting blade 11 can be displaced relative to the stationary cutting blade 16 along a cutting plane E, see FIG. 5.

With respect to the cutting plane E, the cutting blades 11, 16 (see FIG. 5, in which the cutting plane E is illustrated as a line) are arranged laterally offset relative to one another. The cutting blades 11, 16 can be moved past one another in this manner. The movable cutting blade 11 is moved past the stationary cutting blade 16 to the extent that the cutting edges 17, 18 overlap for complete severance of an item to be cut 3.

The pivotable frame section 14 is attached to the stationary frame section 13 so as to be capable of being pivoted about a bolt 19 which defines an axis x, see FIG. 5. The axis x is oriented vertically to the cutting plane E. For this purpose, an end of the pivotable frame section 14 seats between the plates of the stationary frame section 13. The pivotable mount is provided by the bolt 19, which extends through the plates of the stationary frame section 13 and the assigned end of the pivotable frame section 14.

Due to the pivotability of the frame section 14 and the stationary cutting blade 16 mounted thereon, a cutting process, in which the cutting head 12 is initially placed around the item to be cut 3 when the cutting head 12 is pivoted, can in particular be executed in the case of a very long item to be cut 3 and/or as a function of the locality, for example in the case of an installed power cable 5.

As a result of pivoting the frame section 14 back into a position in which the cutting edge 18 of the stationary cutting blade 16 is located opposite to the cutting edge 17 of the movable cutting blade 11 in the direction of displacement r thereof, the cutting head 12 is closed after this.

Figure 2:
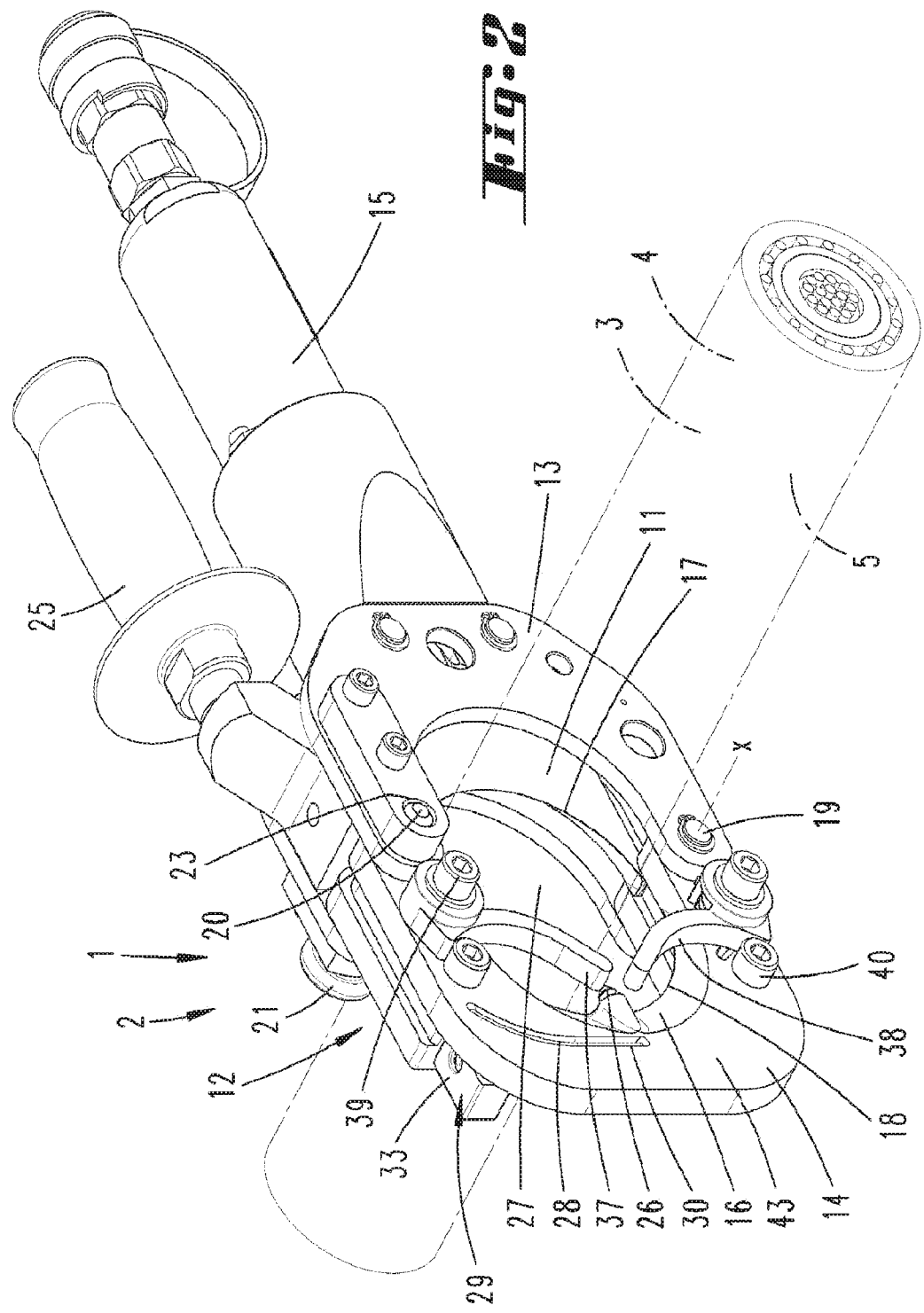
FIG. 2 shows the device in perspective illustration relating to an initial position.
Figure 3:
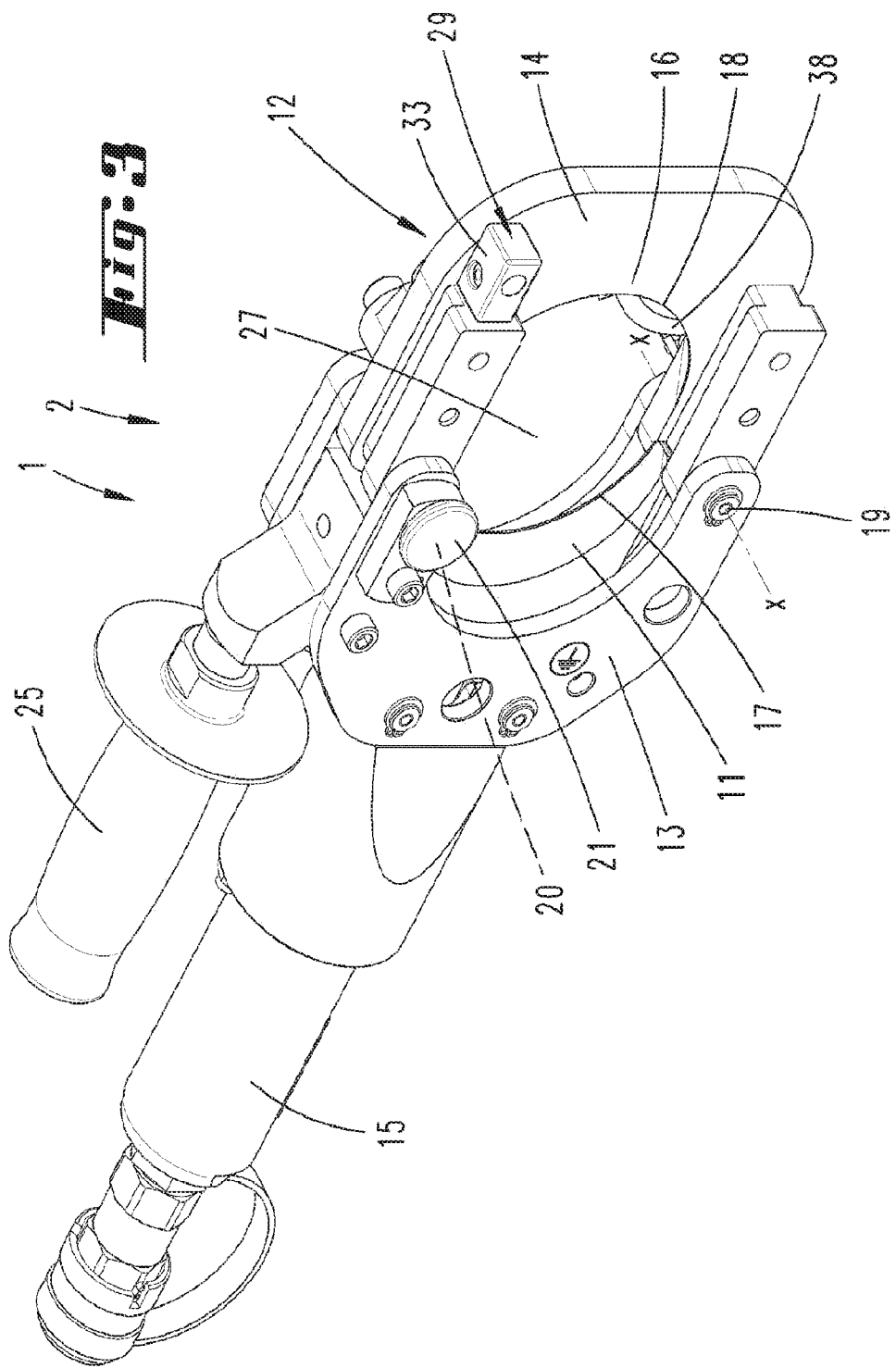
FIG. 3 shows a perspective rear view for this.
Figure 4:
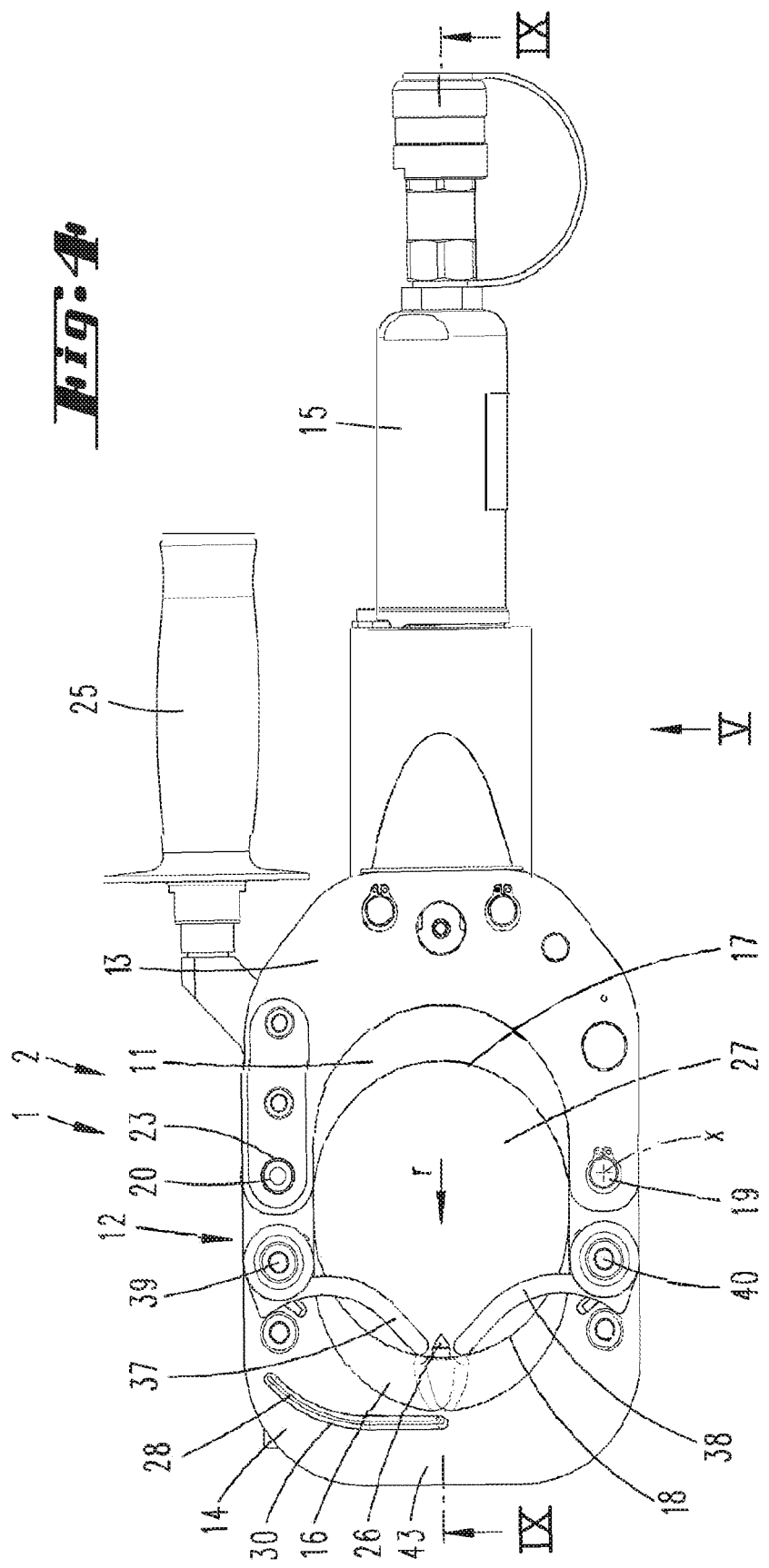
FIG. 4 shows the device in side view.

The operating position shown in FIG. 2 can be fixed, for example, in a hold-open position.

In the disclosure, a locking bolt 20, which is oriented parallel to the bolt 19 and which can be displaced in axial direction of the bolt, serves this purpose.

The locking bolt 20 is held and guided in the stationary frame section 13 and has a handling collar 21, which can be seized manually.

In a locked position, the locking bolt 20 extends through a locking aperture 22 of the pivotable frame section 14 and has a free end which extends into a receiving hole 23 in one of the plates forming the stationary frame section 13.

The locking bolt 20 is spring-loaded towards this locked position.

An unlocking for releasing the pivotable frame section 14 can be attained by powerfully displacing the locking bolt 20 in axial direction thereof against the spring force, until the locking bolt 20 leaves the locking aperture 22 of the pivotable frame section 14. This allows the pivotable frame section 14 to pivot relative to the stationary frame section 13 around bolt 19 as shown in FIG. 13.

Figure 13:
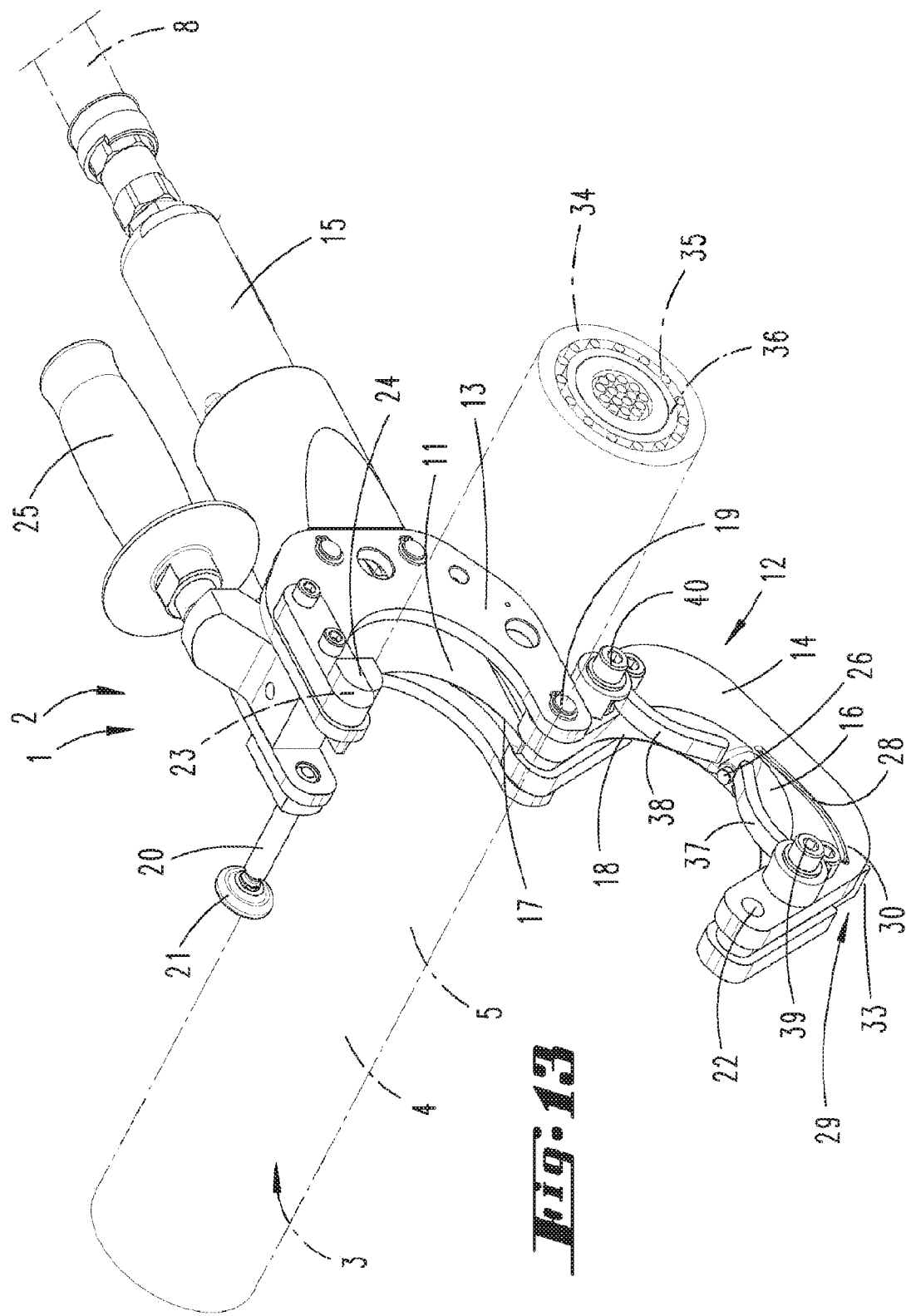
FIG. 13 shows an illustration, which corresponds to FIG. 2, relating to a further embodiment with open cutting head.
Figure 11:
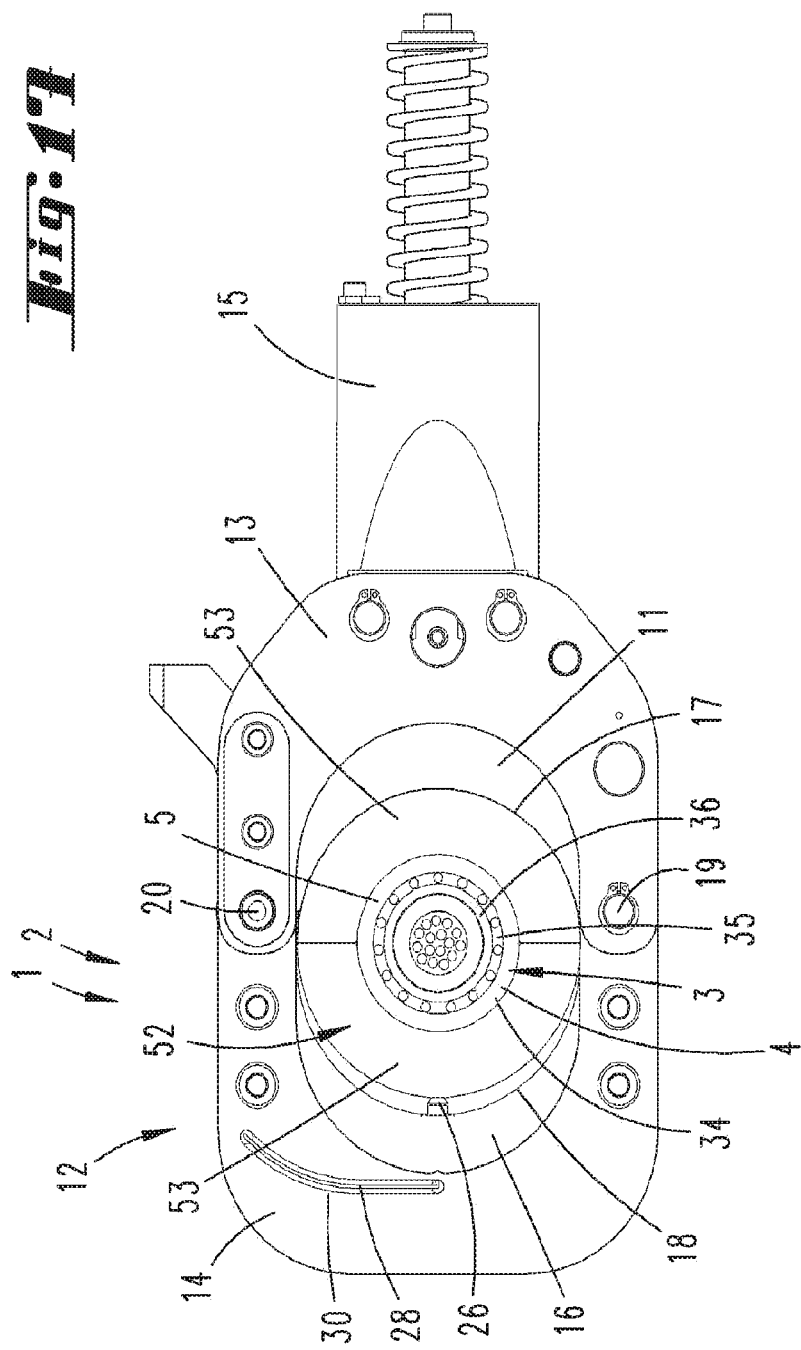

As illustrated in FIG. 13, the position of the locking bolt 20, in particular the locked position, can be registered in a sensory manner by registering the position of the free end of the locking bolt 20, which faces away from the handling collar 21, in the receiving hole 23. For this purpose, a corresponding sensor 24, see FIG. 13, can be arranged in the region of the receiving hole 23. This can be a proximity sensor or also a contact sensor.

Provision can furthermore be made on the stationary frame section 13 for a further handle 25.

The cutting device 2 or device 1, respectively, is provided with a measuring device which includes an electrical measuring probe 26 and an evaluation and transmission controller 29 which are electrically connected together.

Figure 10:
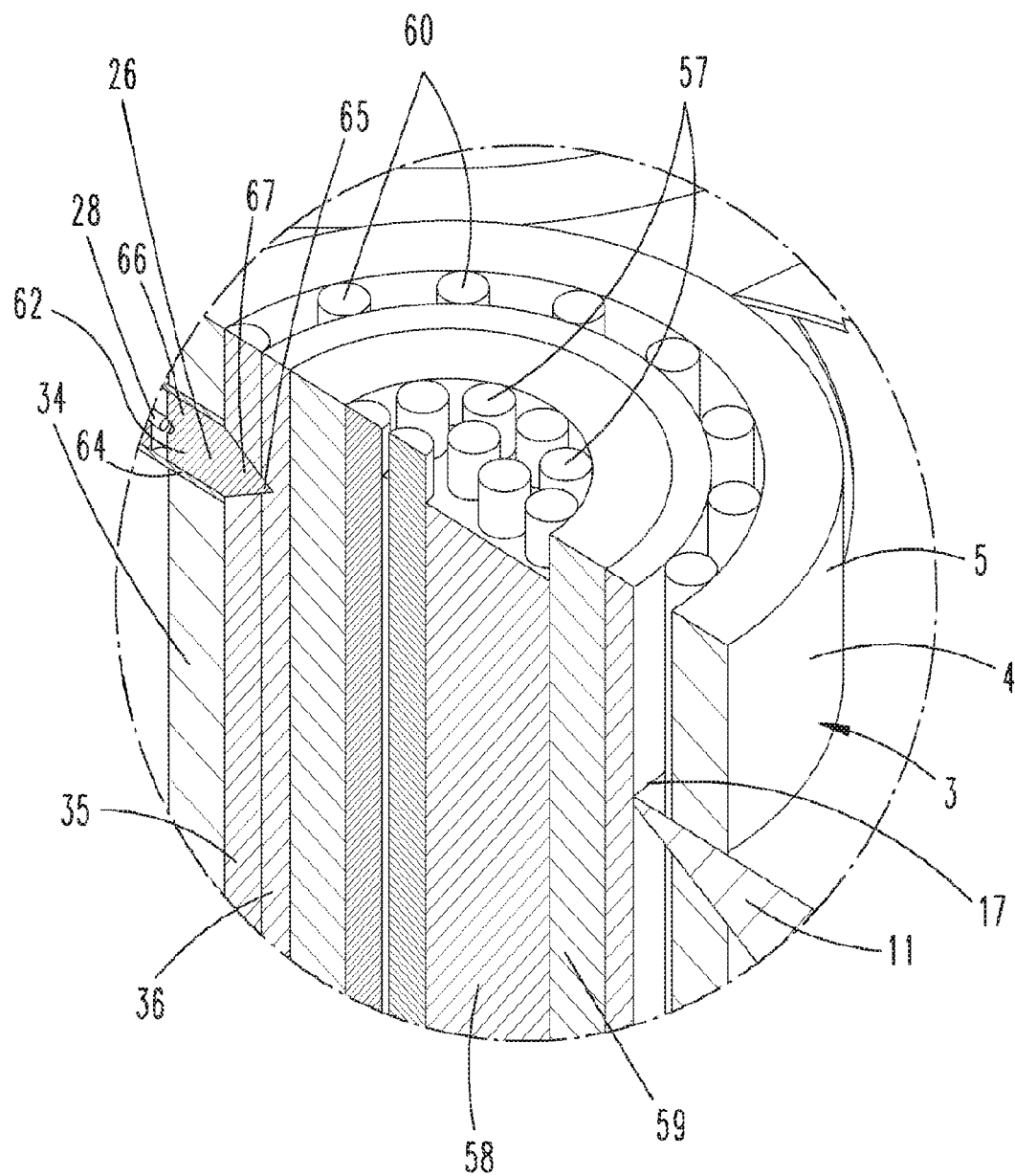
FIG. 10 shows the enlargement of the region X in FIG. 9.

As is illustrated, the measuring probe 26 may be embodied as a spike 62 having an insulative sheath 64 surrounding the portions of which are to remain electrically isolated from the cutting device 2 or device 1, and a spike tip 65 having a portion thereof which remains exposed. The insulative sheath 64 may be formed of ceramic. The spike tip 65 is conductive. As shown in FIG. 10, the spike 62 has a cylindrical section 66 having a cone 67 attached to an end of the cylindrical section 66. The spike tip 65 is formed by part of the cone 67. The insulative sheath 64 surrounds the cylindrical section 66 and part of the cone 67. As shown in FIG. 20, the insulative sheath 64 only surrounds the cylindrical section 66 and the spike tip 65 is formed by the cone 67. In FIG. 21, the insulative sheath 64 extends along a majority of the cylindrical section 66, but leaves an outer shoulder 68 of the cylindrical section 66 exposed. The spike tip 65 is formed by the cone 67 and the shoulder 68. FIGS. 22A and 22B show that the spike 62 has a cylindrical section 66 having a protruding spike tip 65 formed therewith. The spike tip 65 has an outer surface 69 which is planar, a first pair of opposing side surfaces 70a, 70b which are radiused and curve inwardly from the cylindrical section 66 to the outer surface 69, and a second pair of opposing side surfaces 71a, 71b which follow along the line of an imaginary cylinder. The insulative sheath 64 surrounds the cylindrical section 66. The radiused side surfaces may follow a single radius or multiple radii which are joined together to form the respective side surface.

In the disclosure, the measuring probe 26 is provided on the pivotable frame section 14. The measuring probe 26 is arranged in a plane parallel to the cutting plane E, in particular facing the side of the stationary cutting blade 16, which faces away from the movable cutting blade 11.

The spike 62 of the measuring probe 26 is parallel to the cutting plane E. The spike 62 is oriented such that the spike 62 faces toward the stationary cutting blade 16 when the cutting head 12 is closed. The spike 62 may be provided in the center of the longitudinal extension of the cutting edge 18 of the cutting blade 16, wherein the spike 62 of the measuring probe 26 is directed in repositioning direction of the movable cutting blade 11 in the operating position, that is, when the cutting head 12 is closed.

The measuring probe 26, in particular the spike tip 65, projects freely beyond the cutting edge 18 of the cutting blade 16 into a cutting device aperture 27, which is formed between the cutting edges 18 when the cutting head 12 is closed and the cutting blades 11, 16 are not yet moved. Accordingly, the measuring probe 26, in particular the spike tip 65 thereof, is arranged upstream of the stationary cutting blade 16 in the course of a cutting process.

As shown, the measuring probe 26 is electrically connected with the evaluation and transmission controller 29 via a line 28. The line 28 leads from the measuring probe 26 at least partially through the pivotable frame section 14, if applicable guided in a trough-like depression 30, which is embodied on a broadside of the pivotable frame section 14.

While a line 28 is shown, it is to be understood that the measuring probe 26 may be electrically connected with the evaluation and transmission controller 29 via a wireless connection.

The evaluation and transmission controller 29 includes, amongst other components, a transceiver, a processor, software, memory, digital logic, for carrying out its functions.

The evaluation and transmission controller 29 is fastened to the pivotable frame section 14, and may be fastened to the side of the stationary cutting blade 16, which faces away from the measuring probe 26.

The evaluation and transmission controller 29 can furthermore be positioned on the pivotable frame section 14 in such a manner that the movable cutting blade 11 moves underneath evaluation and transmission controller 29 in the course of a cutting process.

The evaluation and transmission controller 29 may have its own power supply. For this purpose, provision can be made in the evaluation and transmission controller 29 for a battery or an accumulator, for example.

According to an aspect of the disclosure, the measuring probe 26, in particular the spike 62, which is electrically connected with the line 28, is embodied as electrical conductor, which is in contact with the evaluation and transmission controller 29 via the line 28. A measuring value is registered in the evaluation and transmission controller 29 and is evaluated to determine whether this measuring value corresponds to or exceeds a predetermined maximum. A signal, which is sent out via the evaluation and transmission controller 29, is generated as a function of the evaluation result.

The evaluation and transmission controller 29 can transfer the signal to a receiving controller 31, see FIG. 1, via radio. In the alternative, for example in the event of an additional electrical supply of the cutting device 2 via the control device 7, if applicable, the signal can also be forwarded to the control device 7 via an additionally provided data line or by modulation.

In the event of a radio transmission, the control device 7 has a corresponding receiving controller 31.

Furthermore, the evaluation and transmission controller 29 can also evaluate a locking signal from the sensor 24. Provision can thus be made for a cutting process to be released only in the event of a generation of a corresponding locking signal which is generated when cutting head 12 is closed and is locked via locking bolt 20. In this case, the cutting device 2 can be activated via the activation switch 9 only by registering the locking signal transmitted via the evaluation and transmission controller 29.

Figure 11:
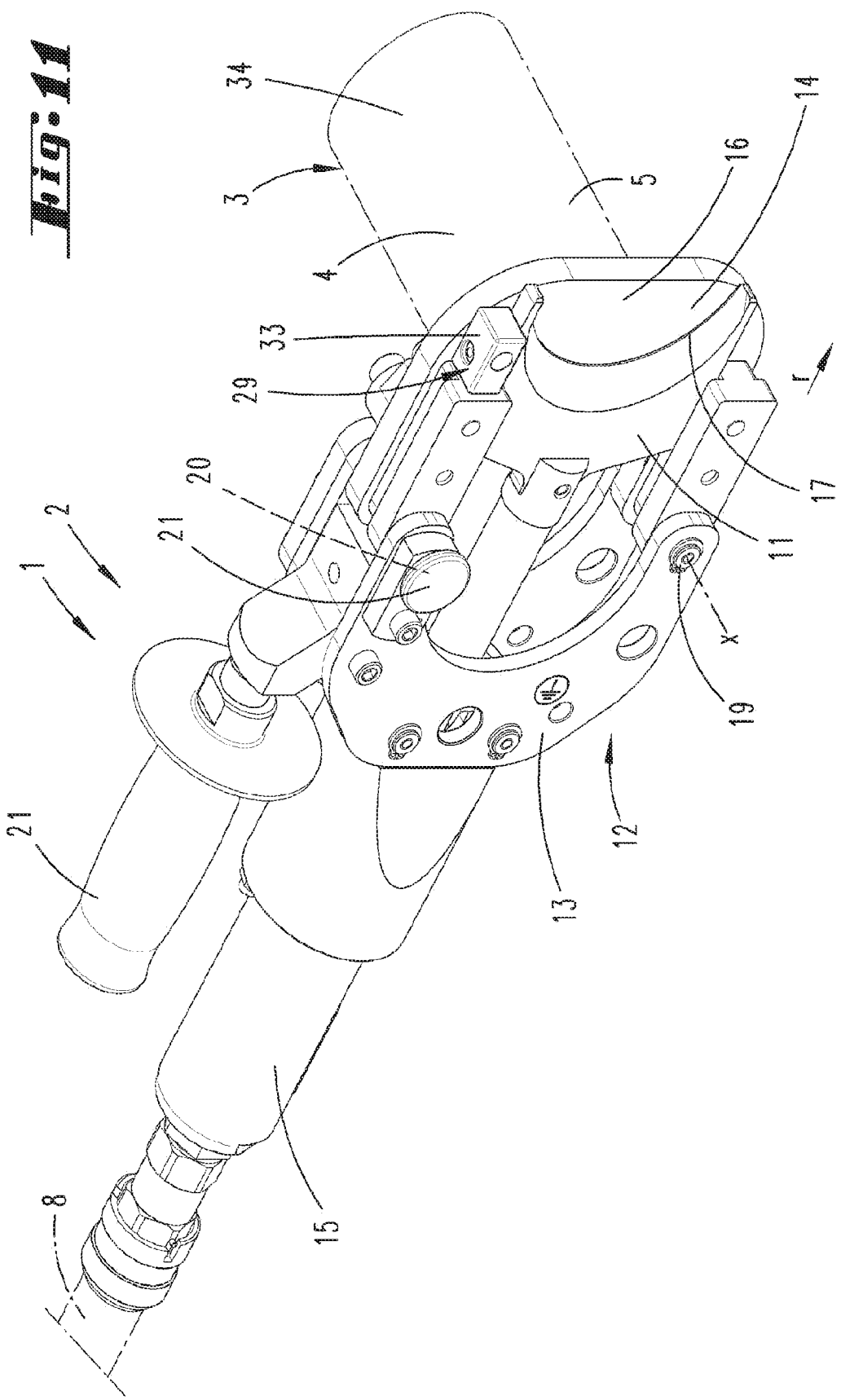
FIG. 11 shows an illustration, which corresponds to FIG. 3, but after complete severance of the strand section.

A successful completion of the cutting process can also be detected by the evaluation and transmission controller 29. The end position of the movable cutting blade 11 illustrated in FIG. 11, for example, in which the cutting edge 17 of the movable cutting blade 11 is moved completely beyond the cutting edge 18 of the stationary cutting blade 16, can thus be detected. For this purpose, the movable cutting blade 11 can have a passive sensor 32, see FIG. 12, which can be interrogated by an active sensor 33, see FIG. 11, here by the evaluation and transmission controller 29.

Figure 12:
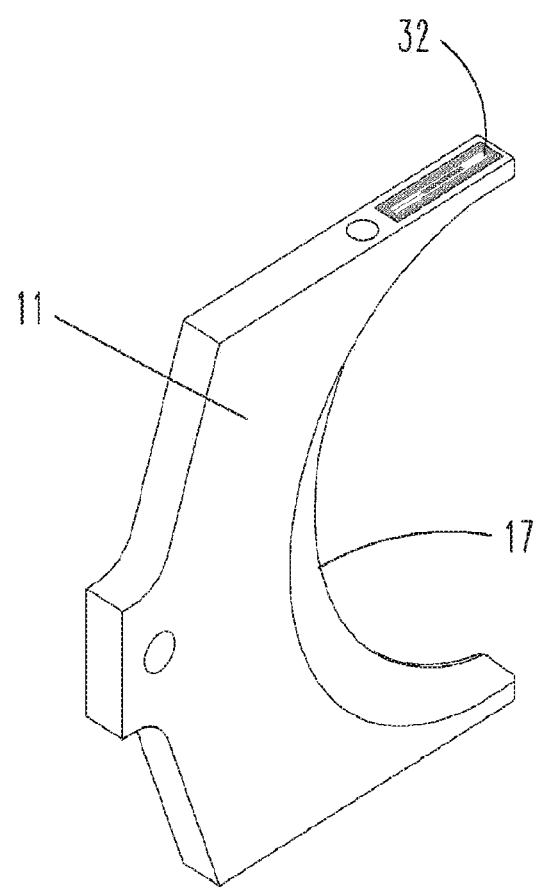
FIG. 12 shows a movable cutting blade of the device in a perspective individual illustration.

As shown in FIG. 12, the passive sensor 32 may be formed as a RFID unit, which is arranged on an edge surface of the movable cutting blade 11, which faces the evaluation and transmission controller 29.

The passive sensor 32 illustrated in FIG. 12 can also be a reflector unit, which reflects light emitted by the evaluation and transmission controller 29 for the detection of the cutting blade position.

A correspondingly generated signal in the event of the registration of the passive sensor 32 triggers an optical or acoustic signal, for example, which conveys to the user that the cutting process has ended. In the alternative or as a combination to this, an automatic return of the movable cutting blade 11 can also be triggered.

A measurement with regard to the electrical load of the power cable 5 is executed by the measuring probe 26 in the course of the severance of a power cable 5 for the transmission of high voltage.

As best shown in FIG. 10, the power cable 5 has internal conductors 57, for example copper conductors, which are embodied for guiding voltage, which are embedded in an insulating material 58 and which are surrounded by it. As a whole, the conductors 57 and the insulating material 58 can be surrounded by an insulating layer 59 (for example including cross-linked polyethylene or rubber).

A conductive sheath 36 surrounds the outside of the insulating layer 59.

A screening layer 35 surrounds the outside of the conductive sheath 36. The screening layer can include, for example, a plurality of spaced apart copper wires 60, which are tin-plated, if applicable.

A cable sheath 34 forms an outer surface of the power cable 5 surrounding it on the outside. The cable sheath 34 includes a cross-linked polyethylene (XLPE) and mechanically protects the screening layer 35 located therebelow.

In the course of moving the movable cutting blade 11 forward, the power cable 5, which is seated within the cutting device aperture 27, is displaced out of a retracted initial position and is moved towards the fixed cutting blade 16 and towards the measuring probe 26. Upon the further movement of the cutting blade 11, the cutting blade 11 applies pressure on the power cable 5 and cuts the power cable 5 until the cutting blade 11 contacts the screening layer 35 to electrically couple the screening layer 35 and the cutting blade 11 together. When the measuring probe 26 contacts the power cable 5, the measuring probe 26 penetrates the cable sheath 34 and the screening layer 35 (or the spike 62 of the measuring probe 26 may pass between adjacent wires 60 which form the screening layer 35) and the tip 65 of the electrically conductive spike 62 penetrates into the conductive sheath 36 to electrically couple the conductive sheath 36 and the spike 62 of the measuring probe 26.

The fixed cutting blade 16 is shifted backwards relative to the measuring probe 26 such that the fixed cutting blade 16 does not contact the screening layer 35.

A continuous voltage measurement is made between the measuring probe 26 and the device ground via the cutting blade 11 during the cutting process.

The cutting process runs such that an outer layer of the power cable 5, the cable sheath 34, is severed at two locations in a first step. These two locations can be at located opposite one another relative to the power cable 5, as is also illustrated in the FIGURES. On principle, two adjacent locations across the length of the power cable 5 can also be used for this purpose.

The severance of an outer layer, in particular of the cable sheath 34, has the effect or is executed to the extent, respectively, that the cutting blade 11 is in contact with the wires 60 of the screening layer 35. The wires 60 are arranged below the outer layer, thus below the cable sheath 34 or on the inside of the cable sheath 34, respectively.

A cut is made into the power cable 5 by the measuring probe 26, namely to the extent that the wires 60 are cut through and that the measuring probe 26 contacts the sheath 36. A resistance measurement is then executed between the measuring probe 26 and the device ground via the cutting blade 11 which is electrically coupled to the screening layer 35.

Finally, a voltage measurement between the measuring probe 26 when in contact with the conductive sheath 36 and the device ground via the cutting blade 11 when in contact with the screening layer 35 is executed. In the event that a voltage can be measured hereby, the power cable 5 is under voltage, thus "live".

Accordingly, a power cable 5, which is under high voltage, leads to a measurable voltage at the screening layer 35.

A high voltage loaded power cable 5 leads to a measurable voltage at the screening layer 35 to ground or against the cutting blade 11 in the millivolt or single-digit Volt range.

In the event of the determination of a corresponding voltage, if applicable in the event of the determination of a predetermined maximum voltage and corresponding evaluation, a signal is generated and is transmitted directly to the device 1 or to the control device 7 via the evaluation and transmission controller 29. An optical or acoustic signal can be emitted, which is to prompt the user to terminate the cutting process. The signal triggers an automatic termination of the cutting process, if applicable a subsequent return of the movable cutting blade 11 into the initial position wherein the cutting blade 11 is disengaged from the power cable 5.

If applicable, the signals transmitted to the control device 7 can be recorded in the control device 7.

Provision can also be made in the control device 7 for a display, on which measuring values of the measuring probe 26 are continually illustrated in a graphic manner.

In particular, in the event of a cutting of electrical power cables 5, but furthermore also in the case of another item to be cut 3, it is necessary to push the item to be cut 3 transverse to the direction of displacement r towards a central region of both cutting blades 11 and 16 in relation to the direction of displacement r of the movable cutting blade 11. In particular, in the case of the arrangement of the measuring probe 26 and of a cutting of the power cable 5, which is to be carried out, a guided displacement of the power cable 5 towards the centrally arranged measuring probe 26 is advantageous in the case of a power cable 5, which has a smaller cross-section than the cutting device aperture 27, so as to be able to correctly execute a voltage test, which is provided as described above.

As shown in FIGS. 1-13, the cutting head 12, in particular the pivotable frame section 14, is provided with two positioning parts 37, 38. The positioning parts 37, 38 are hinged in a pivotably movable manner proximate to the ends of the pivotable frame section 14, on the flat side of the frame section 14, which faces away from the evaluation and transmission controller 29, wherein the pivot axis of the positioning parts 37, 38 runs parallel to the pivot axis x of the frame section 14.

Bolts 39, 40 are mounted on the pivotable frame section 14. The positioning parts 37, 38 are guided on the bolts 39, 40 and are loaded via springs 41, 42 in an initial position, which is stop-limited.

Starting at the bolts 39 and 40, the positioning parts 37, 38 extend so as to be curved in the shape of a segment of a circle in relation to a projection towards the cutting plane E, with the spike 62 of the measuring probe 26 seated between the positioning parts 37, 38 such that the spike 62 is within the cutting device aperture 27. The curvature of the positioning parts 37, 38 is oriented towards the movable cutting blade 11. Free ends of the positioning parts 37, 38 are oriented towards the measuring probe 26.

A V-shaped constriction of the cutting device aperture 27 is formed by the positioning parts 37, 38 and extends towards the measuring probe 26. As a result, an item to be cut 3, for example a power cable 5, is pushed automatically towards the centrally oriented measuring probe 26 by slow displacement via the movable cutting blade 11.

The positioning parts 37, 38 pivot and give way to the force of the springs 41, 42 about the axes of the bolts 39, 40 in the course of the execution of the cutting process.

FIG. 14 shows alternative positioning parts 37, 38. The positioning parts 37, 38 have an axis which centrally intersects the cutting device aperture 27 in the direction of displacement r. The two positioning parts 37, 38 are arranged in the region of a journal 43 of the pivotable frame section 14, which connects the ends of the pivotable frame section 14, on both sides of this axis. The measuring probe 26 is positioned on the journal 43 between the positioning parts 37, 38. The positioning parts 37, 38 are connected to journal 43 by bolts 39, 40 which extend through support regions of the positioning parts 37, 38, and the positioning parts are pivotable about axes through bolts 39, 40, which run parallel to the pivot axis x herein.

The support regions of the positioning parts 37, 38 are connected to one another in a gear-driven manner, in particular by of gear wheels 44, 45. Accordingly, the pivot displacement of a positioning part 37, 38 leads via the gear wheels 44, 45 to the counter-directional orientation, which draws the same angle to the central axis, of the other positioning part 38, 37.

The orientation of the positioning parts 37, 38, which run in a V-shaped manner and which can thus be pre-adjusted by the user, can be fixed via a screw 46. Provision can also be made at the journal 43 for markings in the form of numbers, by a pre-adjustment can be made so as to be matched to the outer diameter dimensions of the item to be cut 3.

Provision can furthermore be made for only one positioning part 37 as a carriage, which is supported in the direction of displacement r of the movable cutting blade 11 (see FIG. 15).

The positioning part 37 of the embodiment in FIG. 15 is formed in a plate-shaped manner, hereby bears on a broadside of the pivotable frame section 14, on the broadside, which faces away from the evaluation and transmission controller 29.

The positioning part 37 has two elongated holes 47, 48, which are oriented in the direction of displacement r and in which guide pins 49, 50 are seated. The guide pins 49, 50 are attached to the pivotable frame section 14. While the guide pins 49, 50 are shown on the frame section 14 and the holes 47, 48 are shown as provided on the positioning part 37, it is to be understood that the guide pins 49, 50 can be provided on the positioning part 37 and the holes 47, 48 provided on the frame section 14.

This provides for a linear guide for the positioning part 37, wherein tension springs 51 acting on the positioning part 37 to load the positioning part 37 towards the movable cutting blade 11.

An outer edge of the positioning part 37, which faces the movable cutting blade 11, is formed as in a V-shape in relation to the spike 62 into the cutting plane E, hereby in each case from the outside towards the journal 43 of the pivotable frame section 14 rising towards the center of the positioning part 37.

An item to be cut 3, which is seated within the cutting device aperture 27, is also pushed via the movable cutting blade 11 along the facing outer edges of the positioning part 37 to the center of the cutting device aperture 27, wherein the positioning part 37 is able to give way in the direction of displacement r in the course of the cutting process.

While the positioning part 37 or positioning parts 37, 38 are shown as being provided on the frame section 14 which houses the stationary cutting blade 16, it is to be understood that the positioning part 37 or positioning parts 37, 38 may be provided on frame section 13 which houses the movable cutting blade 11.

Provision can furthermore be made for an adapter 52, see FIG. 16, for centering an item to be cut 3 in the cutting device aperture 27.

The adapter 52 is a part which, as a whole, has the shape of a pipe section, and is made of a material which can be cut quickly, such as foam or soft plastic, for example. The adapter 52 may have a circular layout.

The adapter 52 has an outer cross-sectional contour, which is matched to the cross-sectional contour of the cutting device aperture 27. The cross-sectional inner contour of the adapter 52 is matched or, due to the material selection, can be matched to the outer cross-section of the item to be cut 3 (here of a power cable 5; see FIGS. 16-18).

The adapter 52 may be formed in two parts, wherein both parts substantially form half shells 53. For pivoting and for surrounding the item to be cut 3, the half shells 53 can be connected with one another, for example via a hinge-like bond seam 54 (see FIG. 19).

According to FIG. 16, the half shells 53 can alternatively have pins 55, which project beyond the parting plane of the adapter 52, for positive accommodation in correspondingly embodied grooves 56. This can be a dove tail-like undercut.

Figure 18:
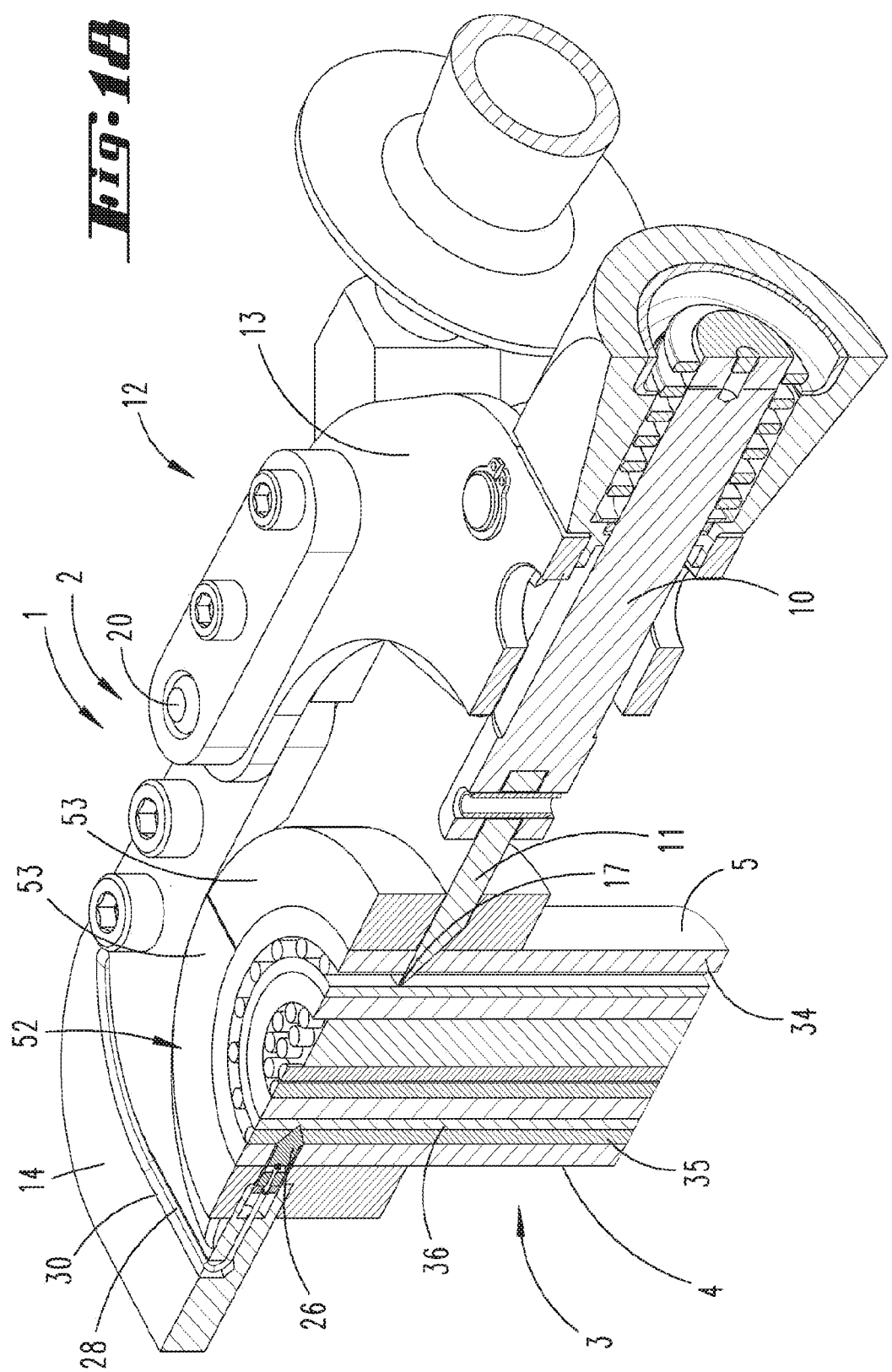
FIG. 18 shows an illustration, which corresponds to FIG. 17, but relating to the cutting or test position, respectively, according to FIG. 8.

As can be seen in particular from the illustration in FIG. 18, the centered arrangement of an item to be cut 3 can be attained in the cutting device aperture 27 by using such an adapter 52. This leads to a favorable cross-section.

When cutting a power cable 5, it is furthermore ensured that a corresponding measuring probe 26, which is positioned in the center, securely penetrates the power cable 5 after penetrating the adapter 52 in the course of the cutting process for penetrating into the conductive sheath 36 so as to test the voltage.

The adapter 52 is severed in the course of the cutting process.

The spike 62 of the measuring probe 26 can be embodied as the cutting blade 16 having an insulative sheath (not shown), like that of insulative sheath 64, surrounding the portions of which are to remain electrically isolated from the cutting device 2 or device 1, with the cutting edge 18 remaining exposed and forming the spike tip, like that of spike tip 65. Like that of insulative sheath 64, the insulative sheath partially surrounding the cutting blade 16 may be formed of ceramic.

The sensors 24, 32, 33 are in communication with the evaluation and transmission controller 29. Such communication may be done via wires or wirelessly.

The above explanations serve to explain the disclosure, which is captured by the application as a whole and which also further develop the state of the art, in each case also independently, at least by the following feature combinations, namely:

A method for the severance of an electrical power cable 5 for the transmission of high voltage, and has a conductive sheath 36 and also a conductive screening layer 35, wherein during the severance of the cable 5 a measurement is executed in terms of the electrical load on the cable 5 by a measuring probe 26, and in the event of registering an electrical load a signal is outputted from the measuring probe 26.

A method, which is characterized in that the signal is an optical, acoustic, or electrical signal.

A method, which is characterized in that the measurement is executed with a measuring device connected with the cutting device 2.

A method, which is characterized in that the measurement is executed repeatedly in the course of the severance.

A method, which is characterized in that in the event of registering an impermissible electrical load on the cable 5 by the signal the severance process is automatically terminated.

A method, which is characterized in that the strand section 4 is surrounded with an adapter 52, which is matched to the aperture dimension of the cutting device aperture 27, and in that the adapter 52 is then introduced with the strand section 4 into the cutting device aperture 27.

A method, which is characterized in that the adapter 52 is destroyed in the course of the severance of the strand section 4.

A device, which is characterized in that the device 1 is in operative connection with an evaluation and transmission controller 29 for purposes of interrogating the electrical load on the cable 5, and the severance process can be interrupted as a function of a signal outputted from the evaluation and transmission controller 29.

A device, which is characterized in that the evaluation and transmission controller 29 communicates with a measuring probe 26, which penetrates into the insulation sheath 36 of the cable 5 in the course of a severance.

A device, which is characterized in that the measuring probe 26 is formed as a spike 62.

A device, which is characterized in that the measuring probe 26 is arranged opposite a movable cutting blade 11.

A device, which is characterized in that the measuring probe 26 is assigned to a stationary cutting blade 16.

A device, which is characterized in that the measuring probe 26 is electrically connected with the evaluation and transmission controller 29.

A device, which is characterized in that the evaluation and transmission controller 29 is arranged remotely from the measuring probe 26.

A device, which is characterized in that the device 1 has a cutting head 12, which surrounds the cable 5 completely.

A device, which is characterized in that the cutting head 12 can be opened.

A device, which is characterized in that the evaluation and transmission controller 29 is arranged on the cutting head 12.

A device, which is characterized in that the evaluation and transmission controller 29 is arranged laterally displaced from a traverse path of the movable cutting blade 11.

A device, which is characterized in that in the closed position the cutting head 12 can be locked by a locking bolt 20.

A device, which is characterized in that the position of the locking bolt 20 can be registered via a sensor 24.

A device, which is characterized in that the position of the locking bolt 20 can be registered and evaluated in the evaluation and transmission controller 29.

A device, which is characterized in that the movable cutting blade 11 can be registered with regard to its position via a sensor 32, 33.

A device, which is characterized in that the movable cutting blade 11 has a passive sensor 32.

A device, which is characterized in that the passive sensor 32 is a magnet, RFID unit and/or reflector unit.

A device, which is characterized in that the passive sensor 32 can be interrogated by an active sensor 33.

A device, which is characterized in that the active sensor 33 is accommodated in the controller 29.

A device, which is characterized in that the evaluation and transmission controller 29 includes software to evaluate information received from the measuring probe 26.

A device, which is characterized in that the evaluation and transmission controller 29 includes a transmitter.

A cutting device, which is characterized in that a positioning part 37, 38 is mounted on the stationary cutting blade 16, which positioning part 37, 38, in the course of the traverse of the movable cutting blade 11, pushes the item 3 to be cut towards a central region of the movable cutting blade 11 with respect to an extent transverse to the direction of displacement r of the movable cutting blade 11.

A cutting device, which is characterized in that the positioning parts 37, 38 can be pivoted.

A cutting device, which is characterized in that the positioning part 37, 38 in total can be moved in a guided manner in a direction of displacement r of the movable cutting blade 11.

A cutting device, which is characterized in that guidance is provided for the positioning part 37, which includes one or a plurality of elongated holes 47, 48 with therein running guide pins 49, 50.

A cutting device, which is characterized in that the positioning part 37, 38 can be deflected counter to the direction of displacement r of the movable cutting blade 11 in the course of a cutting operation.

A cutting device, which is characterized in that two positioning parts 37, 38 are arranged.

A cutting device, which is characterized in that the positioning parts 37, 38 are arranged in a V-shape.

A cutting device, which is characterized in that the positioning part 37, 38 is attached to the fixed cutting blade 16.

An adapter 52, which is characterized in that the adapter 52 is formed from a material that can be cut easily, such as foam, plastic, such as, in particular, soft plastic, or balsa wood, and that the adapter 52 is formed in two parts, wherein the parts can be connected with one another for purposes of pivoting.

An adapter 52, which is characterized in that the adapter 52 has an essentially circular layout with respect to a view in which a geometric axis of an aperture of the adapter 52 for the passage of the item to be cut 3 is in the form of a point.

LIST OF REFERENCE NUMERALS 1 device
2 cutting device
3 item to be cut
4 strand section
5 power cable
6 trench
7 control device
8 hydraulic hose
9 activation switch
10 piston
11 movable cutting blade
12 cutting head
13 frame section
14 frame section
15 handling section
16 cutting blade
17 cutting edge
18 cutting edge
19 bolt
20 locking bolt
21 handling collar
22 locking aperture
23 receiving hole
24 sensor
25 handle
26 measuring probe
27 cutting device aperture
28 line
29 evaluation and transmission controller
30 depression
31 receiving controller
32 passive sensor
33 active sensor
34 cable sheath
35 screening layer
36 conductive sheath
37 positioning part
38 positioning part
39 bolt
40 bolt
41 spring
42 spring
43 journal
44 gear wheel embodiment
45 gear wheel embodiment 46 screw
47 elongated hole
48 elongated hole
49 guide pin
50 guide pin
51 tension spring
52 adapter
53 half shell
54 bond seam
55 pin
56 groove
57 conductor
58 insulating material
59 insulating layer
60 wire
62 spike
64 insulative sheath
65 spike tip
66 cylindrical section
67 cone
68 outer shoulder
69 outer surface
70a, 70b opposing side surfaces
71a, 71b opposing side surfaces
r direction of displacement
x axis
E cutting plane

What is claimed is:

1. A device used to sever an electrical power cable during a cutting operation, the device comprising:
   a frame having a first frame section and a second frame section which are movable relative to each other, wherein the first and second frame sections are movable into an open position to allow insertion of the electrical power cable therein and into a closed position to define a closed cavity such that the cutting operation can be carried out;
   a first cutting blade carried by the first frame section, the first cutting blade having a cutting edge and being movable relative to the frame during the cutting operation;
   a second cutting blade having a cutting edge, the second cutting blade being carried by the second frame section and being stationary relative to the frame during the cutting operation, wherein the cutting edge of the first cutting blade moves completely past the cutting edge of the second cutting blade upon movement of the first cutting blade relative to the frame to complete a severing of the electrical power cable;
   a locking bolt which is configured to lock the first and second frame sections into the closed position to form the closed cavity;
   a first sensor configured to sense the locking bolt and generate a signal representing that the closed cavity is formed;
   a second sensor coupled to the frame; and
   a target attached to the first cutting blade and movable therewith, the second sensor being configured to detect the target and to generate an end position signal in response to detection of the target, wherein the end position signal represents completion of the severing of the electrical power cable.

2. The device of claim 1, wherein the target is at least one of a magnet, an RFID unit, and a reflector unit.

3. The device of claim 1, further comprising
   a controller; and
   a probe configured to penetrate an insulation sheath of the electrical power cable, the probe being in communication with the controller, wherein the controller is configured to receive information from the probe and to interrupt severing of the electrical power cable by the first and second cutting blades in response to the information.

4. The device of claim 3, wherein the first and second sensors are in communication with the controller.

5. The device of claim 3, wherein the probe protrudes outwardly from the second cutting blade and into the cavity, the first cutting blade being movable relative to the probe.

6. The device of claim 3, wherein the probe comprises a conductive spike.

7. The device of claim 3, wherein the probe comprises a conductive spike partially surrounded by an insulative sheath, the conductive spike configured to penetrate the insulation sheath of the electrical power cable.

8. The device of claim 3, wherein the probe is arranged opposite the second cutting blade.

9. The device of claim 3, wherein the probe is provided on the second cutting blade.

10. The device of claim 3, wherein the controller is arranged in a position which is laterally displaced from a traverse path of the first cutting blade.

11. The device of claim 1, wherein the cutting edge of the first cutting blade is laterally offset from the second cutting blade and the cutting edge of the first cutting blade moves completely past the cutting edge of the second cutting blade upon longitudinal movement of the first cutting blade relative to the frame to complete the severing of the electrical power cable.

12. The device of claim 1, wherein the cutting edge of each cutting blade defines an acute angle in cross-section.

13. The device of claim 1, wherein the locking bolt extends through the first and second frame sections.

14. The device of claim 1, wherein the first sensor is configured to sense a free end of the locking bolt.

15. The device of claim 14, wherein the free end of the locking bolt is configured to seat within a receiving hole on the first frame section.

16. The device of claim 15, wherein the locking bolt is spring-loaded and mounted on the first frame section.

17. The device of claim 14, wherein the first sensor is one of a proximity sensor and a contact sensor.

18. The device of claim 1, wherein the first and second frame sections are pivotable relative to each other around a pivot point, and the locking bolt is mounted on the first frame section is configured to extend through the first and second frame sections to provide a lock, the first frame section further having a receiving hole which is configured to receive a free end of the locking bolt, and wherein the first sensor is configured to sense the free end of the locking bolt.

19. The device of claim 18, wherein the first sensor is one of a proximity sensor and a contact sensor.

20. The device of claim 18, wherein the locking bolt is spring-loaded.

* * * * *